US011469104B2

(12) United States Patent
Lee et al.

(10) Patent No.: US 11,469,104 B2
(45) Date of Patent: Oct. 11, 2022

(54) NANOWIRE BENDING FOR PLANAR DEVICE PROCESS ON (001) SI SUBSTRATES

(71) Applicant: UNM RAINFOREST INNOVATIONS, Albuquerque, NM (US)

(72) Inventors: Seung-Chang Lee, Albuquerque, NM (US); Steven R. J. Brueck, Albuquerque, NM (US)

( * ) Notice: Subject to any disclaimer, the term of this patent is extended or adjusted under 35 U.S.C. 154(b) by 5 days.

(21) Appl. No.: 16/662,236

(22) Filed: Oct. 24, 2019

(65) Prior Publication Data

US 2020/0058500 A1 Feb. 20, 2020

Related U.S. Application Data

(63) Continuation of application No. 15/573,772, filed as application No. PCT/US2016/032501 on May 13, 2016, now Pat. No. 10,483,105.

(Continued)

(51) Int. Cl.
H01L 21/02 (2006.01)
H01L 21/8238 (2006.01)
(Continued)

(52) U.S. Cl.
CPC .... H01L 21/02664 (2013.01); B81C 1/00111 (2013.01); B82Y 10/00 (2013.01);
(Continued)

(58) Field of Classification Search
CPC ......... H01L 21/02664; H01L 21/02236; H01L 21/2855; H01L 21/30608; H01L 21/31116;
(Continued)

(56) References Cited

U.S. PATENT DOCUMENTS 8,064,249 B2 11/2011 Jang et al.
8,785,226 B2 7/2014 Lee et al.
(Continued)

FOREIGN PATENT DOCUMENTS

WO WO 2007/008088 A1 1/2007
WO WO 2010/062644 A2 6/2010

OTHER PUBLICATIONS

Tomioka et al., "Steep-slope Tunnell Field-Effect Transistors using III-V Nanowire/Si Heterojunction.", Symposium on VLSI Technology Digest of Technical Papers, 2012, 2 pages.
(Continued)

*Primary Examiner* — Ahmed N Sefer
(74) *Attorney, Agent, or Firm* — MH2 Technology Law Group LLP

(57) ABSTRACT

Provided is a method for growing a nanowire, including: providing a substrate with a base portion having a first surface and at least one support structure extending above or below the first surface; forming a dielectric coating on the at least one support structure; forming a photoresist coating over the substrate; forming a metal coating over at least a portion of the dielectric coating; removing a portion of the dielectric coating to expose a surface of the at least one support structure; removing a portion of the at least one support structure to form a nanowire growth surface; growing at least one nanowire on the nanowire growth surface of a corresponding one of the at least one support structure, wherein the nanowire comprises a root end attached to the growth surface and an opposing, free end extending from the root end; and elastically bending the at least one nanowire.

20 Claims, 19 Drawing Sheets

Related U.S. Application Data

(60) Provisional application No. 62/315,411, filed on Mar. 30, 2016, provisional application No. 62/214,578, filed on Sep. 4, 2015, provisional application No. 62/160,917, filed on May 13, 2015.

(51) Int. Cl.

| | | |
|---|---|---|
| *H01L 29/423* | (2006.01) | |
| *H01L 29/66* | (2006.01) | |
| *H01L 27/092* | (2006.01) | |
| *H01L 29/786* | (2006.01) | |
| *H01L 29/06* | (2006.01) | |
| *B82Y 10/00* | (2011.01) | |
| *B81C 1/00* | (2006.01) | |
| *H01L 21/285* | (2006.01) | |
| *H01L 21/306* | (2006.01) | |
| *H01L 21/311* | (2006.01) | |
| *B82Y 40/00* | (2011.01) | |

(52) U.S. Cl.
CPC .. *H01L 21/02236* (2013.01); *H01L 21/02381* (2013.01); *H01L 21/02433* (2013.01); *H01L 21/02532* (2013.01); *H01L 21/02535* (2013.01); *H01L 21/02546* (2013.01); *H01L 21/02603* (2013.01); *H01L 21/02639* (2013.01); *H01L 21/02645* (2013.01); *H01L 21/02653* (2013.01); *H01L 21/2855* (2013.01); *H01L 21/30608* (2013.01); *H01L 21/31116* (2013.01); *H01L 21/823807* (2013.01); *H01L 27/092* (2013.01); *H01L 29/0673* (2013.01); *H01L 29/42392* (2013.01); *H01L 29/66742* (2013.01); *H01L 29/78681* (2013.01); *H01L 29/78684* (2013.01); *H01L 29/78696* (2013.01); *B82Y 40/00* (2013.01); *H01L 27/0922* (2013.01)

(58) Field of Classification Search
CPC ....... H01L 21/823807; H01L 29/42392; H01L 29/66742; H01L 27/092; H01L 29/78681; H01L 29/78684; H01L 29/78696; H01L 29/0673; H01L 21/02381; H01L 21/02433; H01L 21/02532; H01L 21/02535; H01L 21/02546; H01L 21/02603; H01L 21/02639; H01L 21/02645; H01L 21/02653; H01L 27/0922; B82Y 10/00; B82Y 40/00; B81C 1/00111

See application file for complete search history.

(56) References Cited

U.S. PATENT DOCUMENTS

| | | | |
|---|---|---|---|
| 2006/0125056 A1* | 6/2006 | Samuelson | C30B 29/605 257/613 |
| 2007/0105356 A1 | 5/2007 | Wu et al. | |
| 2008/0142926 A1* | 6/2008 | Seifert | H01L 21/02488 257/615 |
| 2008/0149914 A1 | 6/2008 | Samuelson et al. | |
| 2009/0256594 A1 | 10/2009 | Zhu | |
| 2010/0112546 A1 | 5/2010 | Lieber et al. | |
| 2010/0295023 A1* | 11/2010 | Franklin | H01L 29/0665 257/24 |
| 2011/0006286 A1 | 1/2011 | Wang et al. | |
| 2011/0121434 A1* | 5/2011 | Li | H01L 21/02653 257/627 |
| 2011/0186879 A1* | 8/2011 | Altebaeumer | H01L 29/76 257/89 |
| 2011/0253981 A1* | 10/2011 | Rooyackers | B82Y 10/00 257/24 |
| 2012/0168713 A1 | 7/2012 | Lee et al. | |
| 2013/0181189 A1* | 7/2013 | Bertin | G06F 30/30 257/29 |
| 2014/0140008 A1 | 5/2014 | Yamaguchi et al. | |
| 2015/0008456 A1 | 1/2015 | Lagrange et al. | |
| 2016/0054659 A1 | 2/2016 | Shin et al. | |
| 2016/0086872 A1 | 3/2016 | Sakita et al. | |
| 2016/0189960 A1 | 6/2016 | Park et al. | |

OTHER PUBLICATIONS

Kishkovich (PCT Officer), PCT Notification of Transmittal of the International Search Report and the Written Opinion of the International Searching Authority, or the Declaration dated Mar. 16, 2017, 10 pages.

* cited by examiner

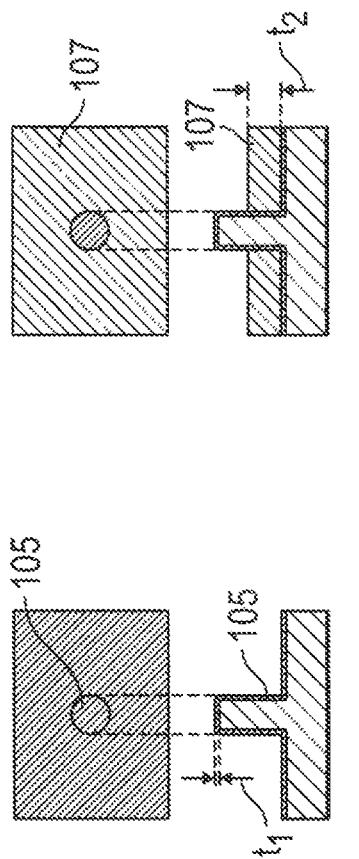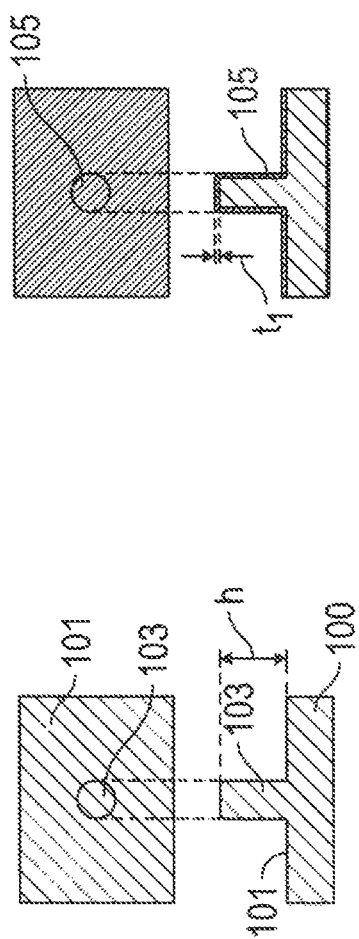

NANOWIRE BENDING FOR PLANAR DEVICE PROCESS ON (001) SI SUBSTRATES

CROSS-REFERENCE TO RELATED APPLICATIONS

This application is a continuation of U.S. application Ser. No. 15/573,772 filed 13 Nov. 2017, now allowed, which is a U.S. National Phase application of PCT/US2016/032501 filed 13 May 2016, and claims priority to U.S. Provisional Patent Application Ser. No. 62/160,917 entitled "NANOWIRE BENDING FOR PLANAR DEVICE PROCESS ON (001) Si SUBSTRATES," which was filed on May 13, 2015; U.S. Provisional Patent Application Ser. No. 62/214,578 entitled "PLANAR GATE-ALL-AROUND COMPLEMENTARY TUNNEL FIELD EFFECT TRANSISTORS BY NANOWIRES GROWN IN POSITION AND LOCATED ON Si(001)," which was filed on Sep. 4, 2015; and U.S. Provisional Patent Application Ser. No. 62/315,411 entitled "EPITAXIAL IN-PLANE NANOWIRE TUNNELING FIELD EFFECT TRANSISTORS ON Si(001) FOR HIGH INTEGRATION DENSITY AND LARGE DRAIN CURRENT," which was filed on Mar. 30, 2016, the entireties of which are incorporated herein by reference.

GOVERNMENT FUNDING

Support for this work was provided by the National Science Foundation (Grant No. EEC-0812056) under a subcontract from Rensselaer Polytechnic Institute for the Smart Lighting Engineering Research Center, by the U.S. Air Force Office of Scientific Research (AFOSR) (Contract No. FA 9550-12-1-0480). The Government has certain rights in the invention.

TECHNICAL FIELD

Embodiments described herein relate generally to methods for manipulating nanowires, specifically for bending nanowires onto planar surfaces, to methods for forming devices according to such methods, and integrating such devices with silicon-based electronics.

BACKGROUND

Electron transport in low dimensional structures is both of fundamental scientific interest and increasingly relevant to future advances in electronics. One-dimensional (1D) transport has been investigated with inherent 1D organic chains such as tetrathiafulvene-tetracyanoquinodimethane (TTF-TCNQ), carbon nanotubes, electron channels fabricated by dry etching or squeezed by a split gate in a field-effect transistor (FET), free-standing semiconductor nanowires (NWs) grown by laser ablation or vapor-liquid-solid (VLS) chemical reactions, and metal quantum point contacts formed by connecting two metal electrodes in a scanning tunneling microscope.

Semiconductor NWs along with carbon nanotubes and graphene have been identified as important directions for future electronics as the limits to traditional scaling of Si integrated circuits become more imminent. While nanowire (NW) research is still at an early stage, most efforts are concentrated on NW fabrication and are limited one-by-one assembly. VLS growth has both a variation of NW sizes, as a result of the varying sizes of the metal seeds used to initiate the growth, and a random placement as a result of the random variation in seed positions. For most VLS NWs, the growth is perpendicular to the substrate which makes contacting and organizing the NWs into circuits quite complex. There is increasing interest in integrating InAs or related III-V nanowire materials as the conduction channel in future generations of electronics as a consequence of the high mobility of these materials as compared with silicon. Current integrated circuits (ICs) have upwards of several billion transistors with transverse dimensions today as small as 15 nm, and spaced by about 15- to about 20 nm, so integration of III-V materials using any sort of post growth processing, involving one-by-one assembly of billions of nanowires, is problematic—i.e., the NWs should be grown in place for further processing into devices and circuits. The lattice mismatch between Si and InAs precludes a simple epitaxial solution without a very thick buffer layer, which is not feasible within the current IC scaling paradigm. It is clear that lithographically defined positioning and control of the NW size would be a preferable approach.

Previous work has shown the growth of GaAs NWs horizontally on a GaAs surface. This required a lattice-matched material system such as AlGaAs and was not applicable to technologically important systems such as InAs on Si. The process also required a sacrificial layer such as AlGaAs that could be oxidized after growth to isolate the NW from the substrate, introducing additional strain as a result of the oxidation.

Many groups have reported the growth of InAs NWs vertically from a Si(111) surface. However, this has many of the same issues as the VLS growth in terms of integrating large numbers of 3-terminal transistor devices in a well defined circuit. The Si(111) surface is not suitable for electronic integration which is uniquely available on the Si(001) surface as a result of the properties of the $SiO_2$/Si (001) interface.

In homo- and hetero-epitaxy on a (001)-oriented Si substrate, NWs grow in <111> directions that are 35.3°-off from the substrate surface. This causes two major problems in their application to Si and III-V microelectronics; one is the random growth along four available <111> directions on (001) and the other is the fabrication of three-terminal contacts (source, gate, drain) to the NWs. There are eight equivalent <111> directions in silicon, four directed upward from a <100> surface, and four downward.

Meanwhile, tunnel field effect transistors (TFET) are emerging as potential replacements for CMOS transistors with low power consumption (lower dark current than possible with CMOS thermionic emission processes) with high on-currents. The most recent comparison of a 16 nm low-power Si FinFET CMOS (gate length 34 nm) with reported TFETs in both experiment and simulation are available from a recent review article. Although several TFETs with different materials and fabrication technologies have been reported, most of them are incompatible with future Si nanoelectronics as a result of degraded material qualities, complicated processing, and/or a substrate orientation incompatible with Si(001).

In principle, complementary TFET devices are feasible with an identical material by controlling either electrons or holes to tunnel at the reverse biased p-n junction or p-i-n structure with gate bias polarity. Because of the different effective masses and mobilities depending on carrier type, however, comparable performances for both p- and n-TFET from the same material that can outperform Si CMOS has yet to be achieved. 2-dimensional materials such as graphene and transition-metal dichalcogenides such as $MoS_2$ need further study for industrial applications.

In$_x$Ga$_{1-x}$As and Ge$_x$Sn$_{1-x}$, nanowires have been proposed for n- and p-TFET respectively with the best performances demonstrated to date. They satisfy small direct bandgap and carrier effective mass for high tunneling probability and low resistance channel to increase on-state current, which are the primary conditions of complementary (C-) TFET to compete with Si CMOS. However, in previous studies they were grown separately on InP and Ge substrates, respectively, and cannot be accommodated into a single substrate and as a result cannot be integrated into Si CMOS microelectronics which exclusively uses Si(001) substrates. The reported TFETs had a conventional FET structure and were fabricated with standard FET processes.

Thus, a process and devices that overcome the problems described above would be a welcome addition to the art.

SUMMARY

In an embodiment, there is a method for growing a nanowire, comprising: providing a substrate comprising a base portion having a first surface and at least one support structure extending either above or below the first surface; forming a dielectric coating on the at least one support structure; forming a photoresist coating over the substrate, wherein the photoresist coating surrounds a portion of the at least one support structure; forming a metal coating over at least a portion of the dielectric coating; removing a portion of the dielectric coating to expose a surface of the at least one support structure; removing a portion of the at least one support structure to form a nanowire growth surface; growing at least one nanowire on the nanowire growth surface of a corresponding one of the at least one support structure, wherein the nanowire comprises a root end attached to the growth surface and an opposing, free end extending away from the support structure; and elastically bending the at least one nanowire.

In another embodiment, there are complimentary tunnel field effect transistor pairs (C-TFET), comprising: a semiconductor substrate comprising a base portion having a first (001) surface and at least two opposing (111)-type facets; a first nanowire comprising a root end and a free end, the first nanowire's root end extending from a first of the at least two opposing (111)-type facets and the free end disposed over an (001) surface of the substrate; and a second nanowire comprising a root end and a free end, the second nanowire's root end extending from a second of the at least two opposing (111)-type facets and the free end disposed over the (001) surface of the substrate, wherein the first nanowire comprises a first material and the second nanowire comprises a second material, and wherein the first and second nanowires are each doped longitudinally and comprise first and second p-i-n junctions, respectively.

In another embodiment, there is a method for fabricating complimentary tunnel field effect transistor (C-TFET) pairs, comprising: providing a (001) semiconductor substrate; exposing at least two opposing (111)-type facets of the substrate; passivating a surface of the substrate with a dielectric film, the dielectric film disposed over the at least two opposing (111)-type facets, forming an array of holes through the dielectric film, the holes exposing the at least two opposing (111)-type facets; depositing a first metal on a first one of the (111)-type facets; depositing a second metal on a second one of the (111-type) facets; growing a first nanowire on the first one of the (111)-type facets with a first growth condition wherein the first metal serves as a growth catalyst for the first nanowire, the first nanowire comprising a root end and a free end extending from the first one of the (111)-type facets; growing a second nanowire on the second one of the (111)-type facets at a second growth condition wherein the second metal serves as a growth catalyst for the second nanowire, the second nanowire comprising a root end and a free end extending from the second one of the (111)-type facets; and physically bending each of the first and the second nanowires such that at least a portion of a surface of their free ends contact an (001) surface of the substrate.

In another embodiment, there is an electronic or optoelectronic nanowire device, comprising: a substrate comprising at least two opposing (111)-type facets; a first nanowire comprising a root end and a free end, the first nanowire's root end extending from a first of the at least two opposing (111)-type facets and the free end disposed over an (001) surface of the substrate; and a second nanowire comprising a root end and a free end, the second nanowire's root end extending from a second of the at least two opposing (111)-type facets and the free end disposed over the (001) surface of the substrate; wherein the first nanowire comprises a first material and the second nanowire comprises a second material, and wherein the first and second nanowires are each doped longitudinally and comprise first and second p-i-n junctions, respectively.

In an embodiment there is a method of forming tunneling field effect transistors ("TFETs"), comprising: growing a nanowire by selective epitaxy from a localized area defined by lithography on a masked (111) facet of silicon on a v-shaped groove or a pillar fabricated into a Si(001) substrate; removing a portion of the nanowire at a first end and at an opposite second end by chemical etching process; forming an array of n- and p-type TFETs along the nanowire by a periodic selective doping process; depositing and fabricating a gate oxide to passivate a tunnel zone for each period of the array; segmenting the nanowire by removing spacers between adjacent members of the array to produce a serial array of sub-nanowires; and depositing and annealing an ohmic metal to the serial array of sub-nanowires to form a source and a drain for each member of the serial array of sub-nanowires.

Additional advantages of the embodiments will be set forth in part in the description which follows, and in part will be understood from the description, or may be learned by practice of the embodiments. The advantages will be realized and attained by means of the elements and combinations particularly pointed out in the appended claims.

It is to be understood that both the foregoing general description and the following detailed description are exemplary and explanatory only and are not restrictive of the embodiments, as claimed.

BRIEF DESCRIPTION OF THE DRAWINGS

The accompanying drawings, which are incorporated in and constitute a part of this specification, illustrate embodiments of the present teachings and together with the description, serve to explain the principles of the disclosure.

FIGS. 1A-H depict a fabrication process for making a nanowire according to an embodiment. The top and bottom panels of each of FIGS. 1A-1H correspond to a top-down and cross-sectional view, respectively, at steps in the fabrication process.

DESCRIPTION OF THE EMBODIMENTS

Figure 2A:
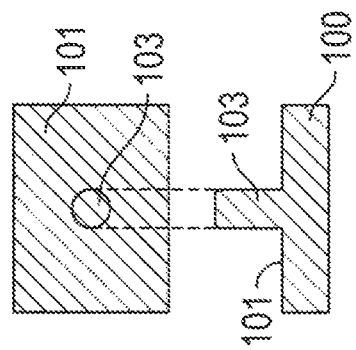
FIGS. 2A-2J depict a fabrication process for making a nanowire according to an embodiment. The top and bottom panels of each of FIGS. 2A-2J correspond to a top-down and cross-sectional view, respectively, at steps in the fabrication process.

Reference will now be made in detail to the present embodiments, examples of which are illustrated in the accompanying drawings. Wherever possible, the same reference numbers will be used throughout the drawings to refer to the same or like parts. Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the figures. Those of skill in the art will appreciate that the following description is exemplary in nature, and that various modifications to the parameters set forth herein could be made without departing from the scope of the present embodiments. It is intended that the specification and examples be considered as examples only. The various embodiments are not necessarily mutually exclusive, as some embodiments can be combined with one or more other embodiments to form new embodiments.

It will be understood that, for simplicity, the structures and/or process steps depicted in the figures may include additional features not depicted, while depicted structures and/or process steps may be removed or modified.

Embodiments described herein overcome challenges associated with random growth along four available <111> directions on a (001) surface. In an example, a protruding support structure, such as a pillar-shaped support structure (also referred to herein as a post), is employed on a substrate (e.g., Si(001)), for example, a non-planar substrate, and patterned coatings formed thereon are provided to form an opening for nanowire nucleation and growth at a preselected facet surface of the pillar. Such an embodiment provides for a single (111)-orientation facet out of the eight available <111> directions on which to nucleate nanowires. The opening and the resulting facet at, for example, an upper portion of the pillar-shaped support structure, guide a nanowire to grow in a preselected single direction. Embodiments described herein provide a solution for the fabrication of contact on the nanowires by providing for the bending of the nanowire described herein toward a nearby surface, such as a step portion of a substrate so that a free end of the grown nanowire is brought into contact and physically touches the step surface, which may be parallel to (001) for coplanar contacts. After bending with a physical contact to the step surface, the nanowire can undergo further processing. For example, the nanowire can be freed from the root (i.e., from the support structure) by separating a lower portion of the nanowire, which contains a majority of the defects associated with lattice mismatch of the substrate and the nanowire material, from a nanowire growth surface. Such methods can be utilized for growing and manipulating an array of nanowires. Embodiments described herein provide for growing many nanowires at lithographically determined positions on a Si(001) surface. Once the bending is completed, the known processes for planar devices can be applied to the nanowires. Accordingly, embodiments described herein are highly favorable for large lattice-mismatched nanowire heteroepitaxy on (001) since the small physical contact area of a nanowire to a growth surface of a substrate induces a minimal stress, and the length of the nanowire immediately adjact to the substrate is removed/eliminated from the active device regions of the nanowire.

According to an embodiment, fabrication of a nanowire according to a process depicted in FIGS. 1A-1H can include the steps of forming at least one support structure on a substrate; forming a first coating over at least a portion of the support structure; forming a second coating over the substrate; forming a third coating over at least a portion of the first coating; removing at least a portion of the first coating to expose a surface of the support structure; removing at least a portion of the support structure by, for example, facet selective etching to form a nanowire growth surface; growing a nanowire on the nanowire growth surface, the nanowire comprising a root end and a free end extending away from the root (and the support structure to which the root is attached); and elastically bending the nanowire. The process may further include separating the nanowire from the support structure at the root end of the nanowire.

To form the nanowire growth surface, at least one isolated side hole may be fabricated in the support structure, for example, by removing all coatings from a surface of the support structure to expose a portion of the support structure, and removing at least a portion of the support structure, for example, by facet selective etching. In an example, the exposed portion of the support structure may be selectively etched to expose the desired growth surface, which may be a <111> crystal face of the substrate.

In FIG. 1A, a substrate comprises a base portion 101 and at least one support structure 103 that extends from the base portion. The support structure 103 may be in the form of a pillar or post structure; alternatively it may be a 2D structure such as a wall. The support structure 103 may comprise a height, h, and may be formed as a portion of the substrate, for example, extending from the base portion. Accordingly, in the case where the substrate comprises a semiconductor crystal structure, the support structure 103 may comprise a crystallographic extension of the substrate.

In an example, the substrate may be a Si (001) substrate. An embodiment includes forming the support structure 103, for example, growing the support structure on a surface of the substrate's base portion, or etching the support structure. In other words, portions of a substrate may be etched to form the base portion and the support structure. Accordingly, the support structure 103 may be formed by a combination of a number of routes well-known-in-the-art involving lithographic definition, isotropic etching, anisotropic etching, oxidation, and combinations thereof. Lithographic definition allows for defined placement of the support structures and for a controlled variation in sizes (of which a homogeneous distribution is one option).

The substrate may comprise at least one of a semiconductor material and crystalline oxide material. For example the substrate may comprise a group IV material such as Si (001) and Ge(001), a III-V semiconductor such as GaAs and InP and related heterostructure materials, or a II-VI semiconductor such as ZnS and ZnSe and related heterostructure materials.

In an embodiment, the first coating may comprise a dielectric. Accordingly, in FIG. 1B a dielectric coating 105 is formed over at least a portion of the support structure 103 and may also be formed over a surface of the substrate. The dielectric coating 105 may be formed by passivating surfaces of the base portion 101 and of the support structure 103. For example, a surface of the support structure may be thermally oxidized, thereby forming a silicon oxide ($SiO_2$) or nitrided forming a silicon nitride ($SiN_x$) film. Surfaces of the substrate's base portion may also be passivated to form a dielectric coating comprising $SiO_2$ or $SiN_x$ film thereon. The thickness $t_1$ of the dielectric coating 105 (i.e., $SiO_2$ or $SiN_x$) at the top of the support structure 103 may comprise dimension that does not exceed a half of the smallest lateral dimension of the support structure. Alternatively, the dielectric coating 105 may be formed by depositing a film of $SiO_2$ on the surface of the support structure by known methods. There are several possible techniques for depositing $SiO_2$. Thermal oxidation provides a superior quality and is guaranteed to completely cover all sides and the top of the support structure 103. The required temperatures for thermal oxidation preclude the presence of metals and most polymer films (such as photoresist). The first coating may be dielectric in order to survive subsequent epitaxial growth steps which, in the case of molecular beam epitaxy (MBE) and metal-organic vapor phase epitaxy (MOVPE) may require growth temperatures of about 600° C. to about 1000° C.

In an embodiment, the second coating may comprise a photoresist, PMMA or a polymer. Accordingly, in FIG. 1C, a photoresist coating 107 is formed over the substrate, for example over the base portion 101 of the substrate. Optionally, the photoresist coating 107 may initially be formed such that it covers the support structure 103 as well (i.e., it may be formed over the support structure in addition to over the substrate's base portion) followed by removal of a portion of the photoresist coating to re-expose at least a portion, such as a top portion, of the support structure 103 (i.e., leaving photoresist over the base portion and on some or none, but not all, of the support structure such as on sidewall portions but not a top portion). In other words, photoresist coating 107 may be deposited over the substrate in such a manner that it initially has a thickness greater than the height h of the support structure 103. After forming the photoresist coating 107 in this way, as shown in FIG. 1C, a portion of the photoresist can be removed to re-expose a top portion of the support structure 103 having dielectric coating 105 formed thereon such that photoresist coating 107 has a thickness $t_2$. The photoresist coating 107 may be formed, therefore, by isotropic etching, for example, via an oxygen plasma. Alternatively, rather than depositing excess photoresist material followed by etching, photoresist coating 107 may be deposited in the first instance to a thickness of $t_2$.

In an embodiment, the third coating may comprise a metal coating 109. Accordingly, as shown in FIG. 1D, a metal coating 109 may be formed over at least a portion of the dielectric coating 105, including that portion on the support structure 103 that is not covered by photoresist coating 107. The metal coating 109 may also be formed on portions of photoresist coating 107 such as on a surface of the photoresist coating. In an embodiment, the metal coating 109 may be discontinuous (i.e., an incomplete coating) in that it may include a discontinuity (i.e., an opening) such that at least a portion of the dielectric coating 105 at an upper portion of the support structure 103 remains uncovered by the metal coating 109. In other words, the metal coating 109 may be deposited such that a portion of the dielectric coating 105 formed on the support structure 103 is not completely covered by the metal coating 109. That is, a metal coating-free area comprises an area where underlying dielectric 105 may be formed over the support structure between portions of the metal coating 109. The metal-free portion may be formed as the result of a deposition-direction-dependence of the depositing process used for forming the metal coating 109, for example e-beam deposition where the substrate is angled relative to the beam direction. For example, the support structure itself may be utilized to cause shadow effects that result in discontinuities in the deposited metal coating 109, thereby resulting in a "side hole" on at least a side of the support structure 103 as shown in FIG. 1D. Thus, during e-beam evaporation over the dielectric coating, the substrate is rotated from a normal of the e-beam axis to provide a shadow coverage.

The side hole may be formed in a preselected direction, such as relative to a selected surface direction of the substrate, to allow for etching of the support structure along a preselected facet in a subsequent step. For example, in the case of a Si (001) substrate, the side hole must be directed to [110] on the (001) substrate surface to allow a (111) facet in a later step.

In an example, the metal coating 109 may comprise Cr, W, Au, Ag and alloys or mixtures thereof. In an example, the metal coating 109 may be deposited over the substrate by e-beam evaporation. In an example of forming the metal coating 109 by e-beam evaporation, an angle between the material flux angle ($\alpha$) 102 and the beam's angle of incidence ($\beta$) 104, as shown in the top-down and cross-sectional views of FIG. 1D (i.e., upper and lower portions, respectively) may be adjusted as needed. In an example, $\alpha < 45°$ and $\beta > 45°$. Accordingly, the discontinuity in the incomplete metal coating 109, may be bounded by the photoresist coating 107 and may provide access for removing exposed portions of the dielectric coating 105.

As shown FIG. 1E, a method of forming a nanowire continues with removing at least a portion of the dielectric coating 105, such as the portion of the first coating not covered by the metal coating 109 (i.e., at the "side hole"), to expose a surface of the support structure 103. The removing of at least a portion of the dielectric coating 105 may include removing a portion of the dielectric coating 105 exposed by the opening and defined by the discontinuity in the metal coating 109. In an example, the dielectric coating 105 may be removed by dry etching. Depending on the etch selectivity between the dielectric coating 105, the support structure 103 covered by the dielectric coating 105, and the metal coating 109, some of the support structure and the exposed dielectric coating 105 not covered by the metal coating 109 (i.e., at the side hole) may also be etched during this removal process. Therefore, unless a the dielectric coating 105 has a thickness that is too large, the support structure 103 may be etched together with the dielectric coating 105 as shown in FIG. 1E. In particular, if the portion of support structure not covered by metal coating 109 (i.e., the side hole) is roughly less than ~50% of the total surface area of the pillar, the step illustrated in FIG. 1E proceeds as shown.

As shown in FIG. 1F, a portion of the support structure may be removed, for example, via facet selective etching, to expose a preselected facet surface of the support structure material. By removing this portion of the support structure 103, for example, using facet selective etching, the exposed facet of remaining support structure can be utilized a nanowire growth surface 103'. To form the nanowire growth surface 103', etchant may gain access to the support structure 103 via the "side-hole", for example, upon removing portions of the dielectric coating 105, such as the portions of the dielectric coating 105 not covered by the metal coating 109 as shown in FIG. 1E. In the case of a Si(001) substrate, a (111) surface of the support structure 103 may be formed, for example, via a facet selective etching process. Generally, Si is not very different from $SiO_2$ with respect to plasma etching, but the etching of Si can be accelerated by adding oxygen gas. However, the similar etch rate between Si and $SiO_2$, and the effects on simultaneous etching thereof, can be minimized if the side hole is small enough (e.g., less than ~50% of the total surface area of the support structure as described above). A facet selective etching process may be used to form the preselected nanowire growth surface. For example, KOH solutions are known to selectively etch Si faster on planes other than <111> leading to the formation of a (111) surface which is desirable for the growth of III-V nanowires.

Figure 1H:
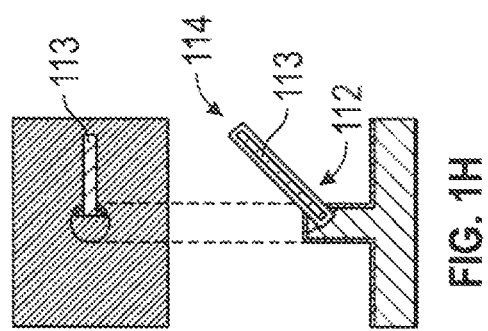
Figure 2C:
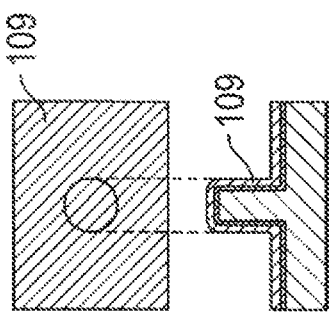
Figure 1G:
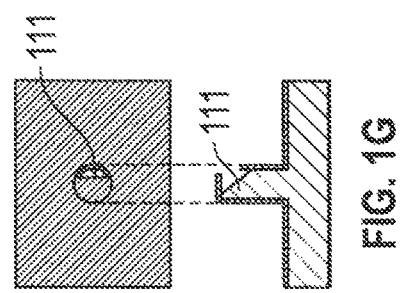

After forming the nanowire growth surface 103', the metal coating 109 and the photoresist coating 107 may be removed using known methods, leaving behind the structure shown in FIG. 1G, which is similar to that in FIG. 1B, except for the opening 111 formed as described for FIG. 1E and the nanowire growth surface 103' formed as described for FIG. 1F. Accordingly, the metal-coating-free portion formed as described for FIG. 1D may be oriented parallel to a <110> direction of the substrate, such that the removing at least a portion of the support structure, for example, via a facet selective etching process, to form the nanowire growth surface comprises forming a (111) face. In the case that the substrate comprises GaAs, removing at least a portion of the support structure to form the nanowire growth surface comprises forming a (111)B facet to provide for an upward directed nanowire. 18. Accordingly the sidehole opening may be directed to (110) or (−1-10), but not (1-10) and not (−110).

A nanowire 113 may then be grown on the nanowire growth surface 103' as shown in FIG. 1H. The nanowire may comprise a root end 112, which may initially be anchored to the nanowire growth surface, and an opposing, free end 114. The nanowire 113 may comprise a heterostructured nanowire. The nanowire 113 may also comprise a semiconductor, such as group III-V, group II-VI, group IV, or oxide materials with longitudinal and/or transverse growth variations. Exemplary compound semiconductors including InAs, a Group IV semiconductor, and any crystalline dielectric material including GaAs, GaN, GaP, GaSb, InN, InP, InSb, HgCdTe, Ge, Si, ZnO, $TiO_2$. The nanowire may be separated from the support structure by separating the root end 112 from the nanowire growth surface 103'. The nanowire may have a length in the range of from about 100 nm to about 5 μm, for example from about 0.5 μm to about 2 μm, and a diameter of from about 0.01 μm to about 0.5 μm, for example from about 10 nm to about 100 nm.

The following provides a more detailed exemplary process flow for executing the process depicted in FIGS. 1A-1H according to an embodiment:

Fabricate a support structure in the form of a pillar on a Si(001) substrate (FIG. 1A). Passivate the surface with a $SiO_2$ film by thermal oxidation (FIG. 1B). Cover the surface with a photoresist (PR) film with a thickness greater than the pillar height for planarization and isotropically etch the PR film from the top with an oxygen plasma to expose the upper part of the pillar (FIG. 1C). Cover the surface with double deposition of Cr film by e-beam evaporation (FIG. 1D). To keep a Cr film-free area at one side of the pillar that is aligned to (110) plane of the Si substrate by the shadow mask effects from the pillar, the angle between the Cr-beam fluxes ($\alpha$) in top-down view and their incident angle ($\beta$) in cross-sectional view of FIG. 1D must be properly adjusted. In this process, $\alpha < 45°$ and $\beta > 45°$ work for this purpose. The Cr-free area bounded by the PR film and the Cr film corresponds to the area for a side hole opening. Remove the $SiO_2$ film exposed through the side hole opening by dry etching (FIG. 1E). Fabricate a single (111) facet by anisotropic wet etching based on introducing an appropriate strength solution of KOH (wet etchant) through the side hole opening (FIG. 1F). Remove the PR film and the Cr film (FIG. 1G).

In another embodiment, fabrication of a nanowire according to a process depicted in FIGS. 2A-2J can include the steps of forming at least one support structure on a substrate; forming a first coating over at least a portion of the structure; forming a second coating over the substrate on the first coating; forming a third coating over at least a portion of the second coating; removing at least a portion of the second coating, for example, via a facet selective etching process, to expose a nanowire growth surface of the support structure; forming a fourth coating; removing at least a portion of the support structure to form a nanowire growth surface; and growing a nanowire on the nanowire growth surface, the nanowire comprising a root end and a free end extending from the root end. The process may further include elastically bending the nanowire. The process may further include separating the nanowire from the support structure at the root end.

In such an embodiment, the first coating may comprise a dielectric coating 105 and may be formed by passivation of the substrate and the support structure surfaces (e.g., thermal oxidation). The second coating in this example may be a metal coating 109, for example, a metal coating comprising Cr, W, Au, Ag and alloys or mixtures thereof. The third coating may be a photoresist, PMMA or a polymer. The fourth coating may be a metal coating 109', may comprise the same metal as the second coating and may extend continuously from the previously deposited second coating except at a side-hole location on the support structure. The second coating, the fourth coating, or both may be deposited by e-beam evaporation as described above. The nanowire may be grown on the nanowire growth surface as described above. The nanowire may comprise a root end connected to the nanowire growth surface and an opposing free end. The nanowire may be separated from the support structure by separating the root end from the nanowire growth surface.

Figure 2D:
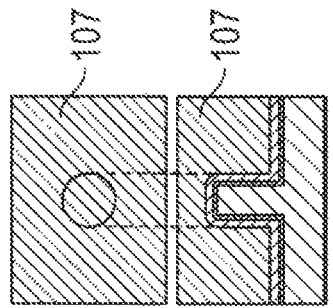
Figure 2B:
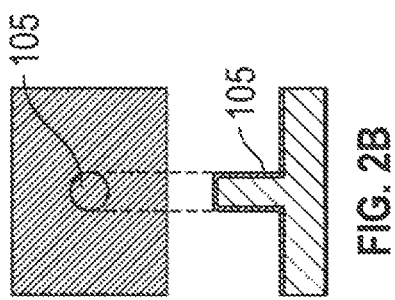
Figure 2G:
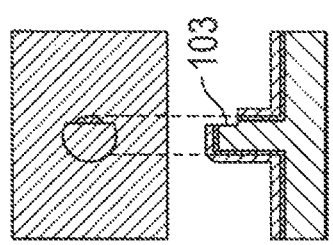
Figure 2J:
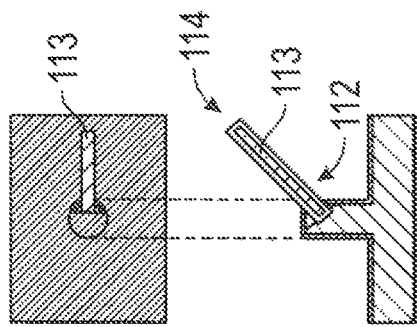
Figure 2F:
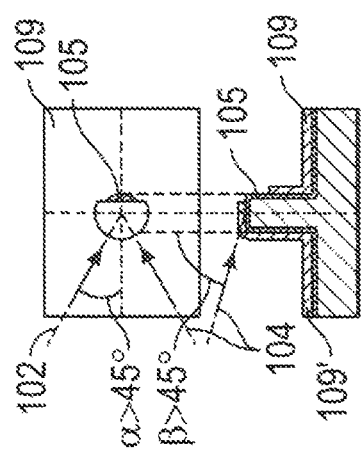
Figure 2I:
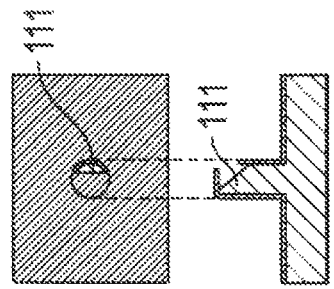
Figure 2E:
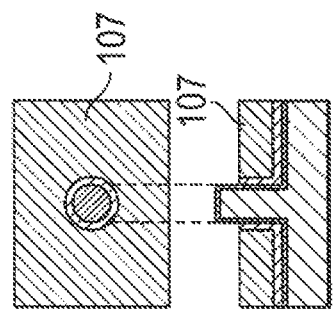
Figure 2H:
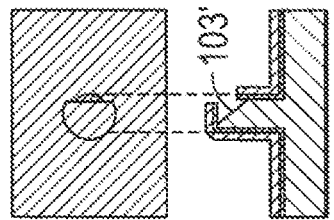

The following provides a more detailed exemplary process flow for executing the process depicted in FIGS. 2A-2J according to an embodiment:

Fabricate a support structure in the form of a pillar on a Si(001) substrate (FIG. 2A). Passivate the surface with a $SiO_2$ film by thermal oxidation (FIG. 2B). A Cr film is conformally deposited on the first coating on the pillar and the substrate (FIG. 2C) Here, this Cr film corresponds to the second coating. A photoresist (PR) film is coated over the Cr film (FIG. 2D). Here, the PR film corresponds to the third coating. The PR film is processed (via, e.g., planarization) so that an upper portion of the support structure with the passivated surface and Cr film formed thereon extends beyond a thickness of the photoresist (not shown). The portion of the Cr film on the exposed upper portion of the support structure is selectively removed (FIG. 2E). After the partial removal of the Cr film, the PR coating is removed (FIG. 2E) followed by double deposition of Cr films which (FIG. 2F) which is as described above for FIG. 1D. Here, the Cr films from double deposition correspond to the fourth coating. At this point, the support structure is completely covered by three Cr films except for the area for a side opening kept Cr-free by shadow effects in the double Cr film deposition which keeps a portion of the dielectric passivated coating exposed on a top portion of the support structure (i.e., the side hole). The following two steps shown in FIGS. 2G and 2H are similar to FIGS. 1E and 1F, respectively, except that the no PR is present in FIGS. 2G and 2H due to its removal in a previous step as described above. The side hole opening, at which the dielectric coating 105 is exposed (i.e., not covered with Cr), must be aligned to one of the [110] directions on the (001) substrate surface. After forming a (111) facet by facet selective etching of the support structure (FIG. 2H), all Cr films are removed (FIG. 2I) and the support structure appears identical to that shown in and described for in FIG. 1G. It is noted here that because PR is sacrificially used only for planarization without lithography in the processes depicted in FIGS. 1A-1H and FIGS. 2A-2J, it can be replaced by any polymer films. A nanowire is then grown on the (111) facet (FIG. 2J). The nanowire may comprise a root end 112, which may initially be anchored to the nanowire growth surface 103' and an opposing, free end 114. The nanowire may be separated from the support structure 103 by separating the root end 112 from the nanowire growth surface 103'.

A plurality of nanowires may be formed according the methods depicted in FIGS. 1A-1H and/or FIGS. 2A-2J, for example, in a 2-dimensional array. As described above, an opening in the dielectric film is fabricated at the side of the support structure 103 and a preselected face (e.g., the (111) facet in the case of a Si(001) substrate) is formed at an upper portion of the support structure as a nanowire growth surface 103'. The nanowire growth surface 103' guides the growth of NW in a single direction. As shown in more detail at FIG. 3, the nanowire grows vertically from the (111) facet, resulting in 35.3°-tilt from the surface of the substrate's base portion.

Figure 3:
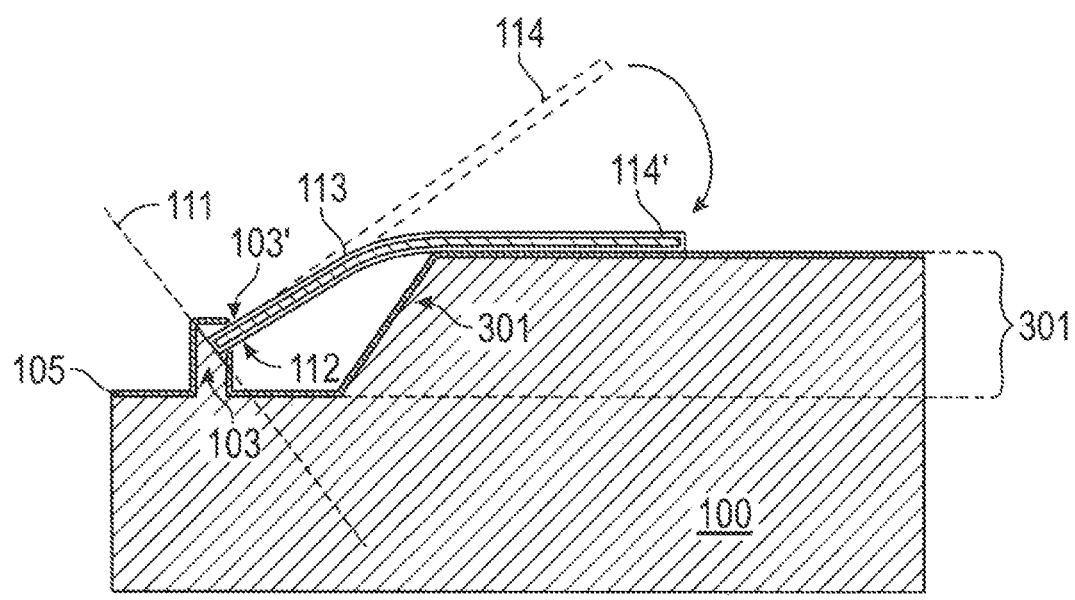
FIG. 3 depicts a schematic illustration of selective growth of a nanowire, such as growth of a nanowire extending from a support structure, such as a protruding pillar structure, formed on a substrate. A dashed and a solid depiction of a nanowire correspond to a nanowire before and after bending, respectively.

Each of the nanowires in an array of nanowires formed according to the methods described herein may be subject to manipulation, such as bending, for example, elastic bending, as shown in FIG. 3. In an embodiment, the nanowire may be manipulated (from a starting position as depicted by the dashed outline and in a direction depicted by the curved arrow) such that at least a portion of the surface of its free end 114 is manipulated to be parallel to a surface of the substrate. Upon bending, the nanowire may be placed in contact with the surface of the substrate.

In FIG. 3, a substrate 100 comprises base portion 101, support structure 103 and a nearby step 301 separated from the support structure by sloped portion. This step 301 is not mandatory for nanowire bending. Therefore, there is no particular condition for the height of the step. After growth, the free end 114 of the nanowire 113 is elastically bent toward the nearby step to make it parallel to the substrate's base portion (e.g., parallel to (001) in the case of a Si(001) substrate) and/or to physically contact the step surface.

In an embodiment, a nanowire can be bent, for example, with a metallic needle. In another embodiment, a plurality of nanowires can be bent simultaneously using, for example, a mechanical plate to bend the nanowires onto nearby horizontal surfaces. In an embodiment, bending all nanowires simultaneously may be performed via mechanical pressing with soft polymer coating. Nanoimprint may be used for simultaneously bending a plurality of nanowires formed according to methods described herein.

The elastic bending of the nanowire illustrated in FIG. 3 may be accomplished mechanically (e.g., with a manipulator such as with a metallic needle), electrically (e.g., via electric force), and/or fluidically (e.g., via surface tension in liquid spinning). In an example, the bending of the at least one nanowire comprises physically contacting the nanowire with a force great enough to elastically deform the nanowire.

Figure 4A:
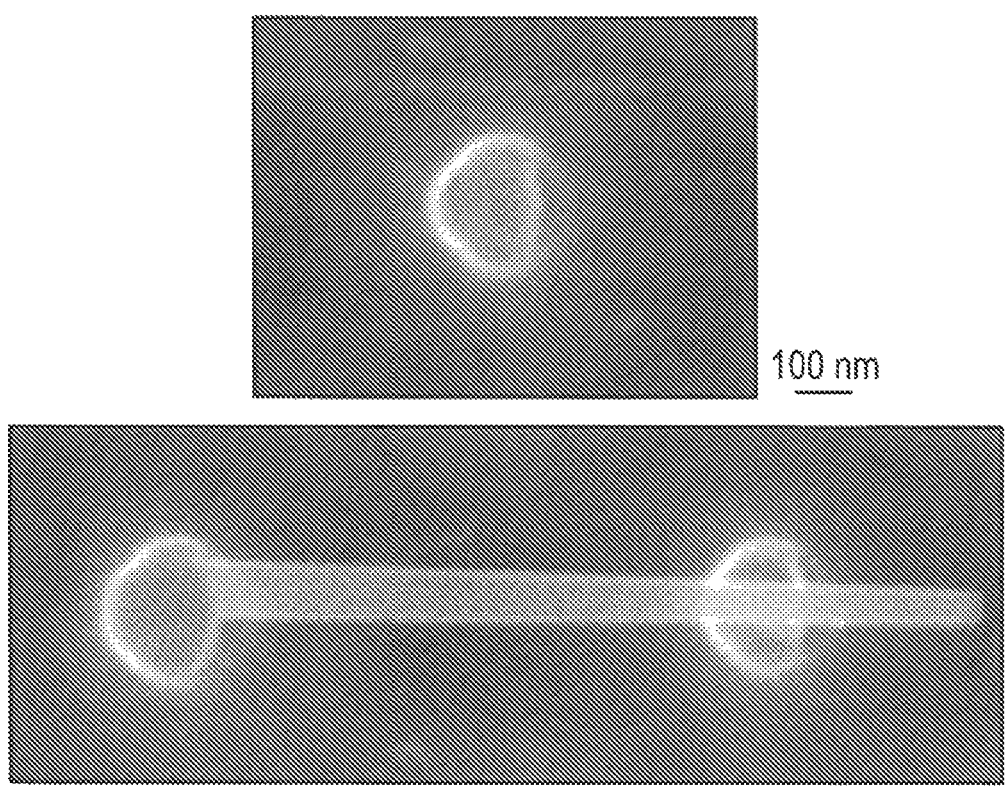
FIG. 4A shows top-down SEM images of a Si support structure formed as a pillar partially covered by an SiO2 dielectric coating (top panel) corresponding to the top-down view of FIG. 1G, and an InAs nanowire grown from a side hole opening in the support structure (bottom panel) corresponding to the top-down view of FIG. 1H.
Figure 4B:
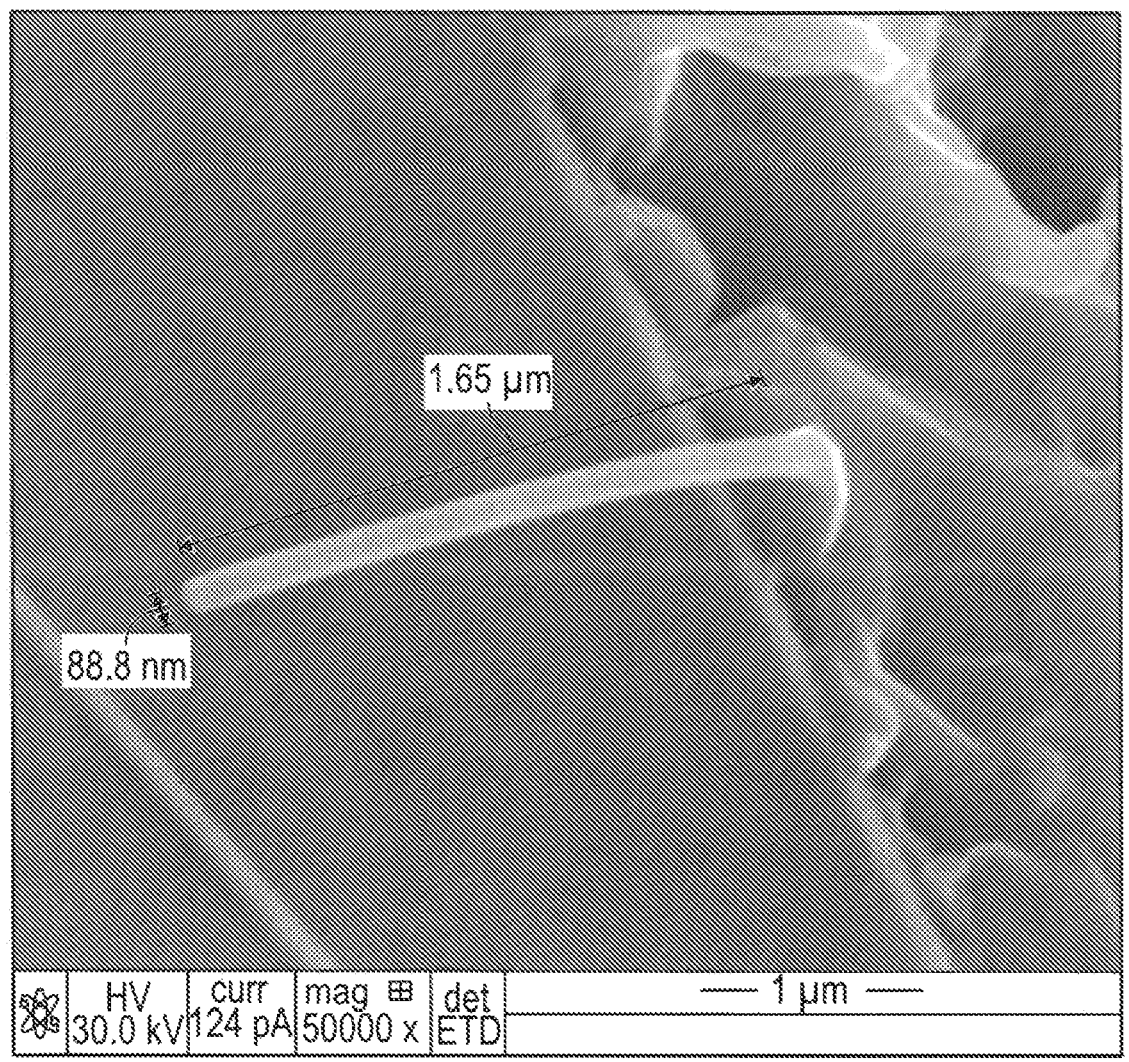
FIG. 4B is an SEM image showing examples of bending a nanowire onto a nearby $SiO_2$ surface by mechanical pressing with a photoresist (PR) film.
Figure 4C:
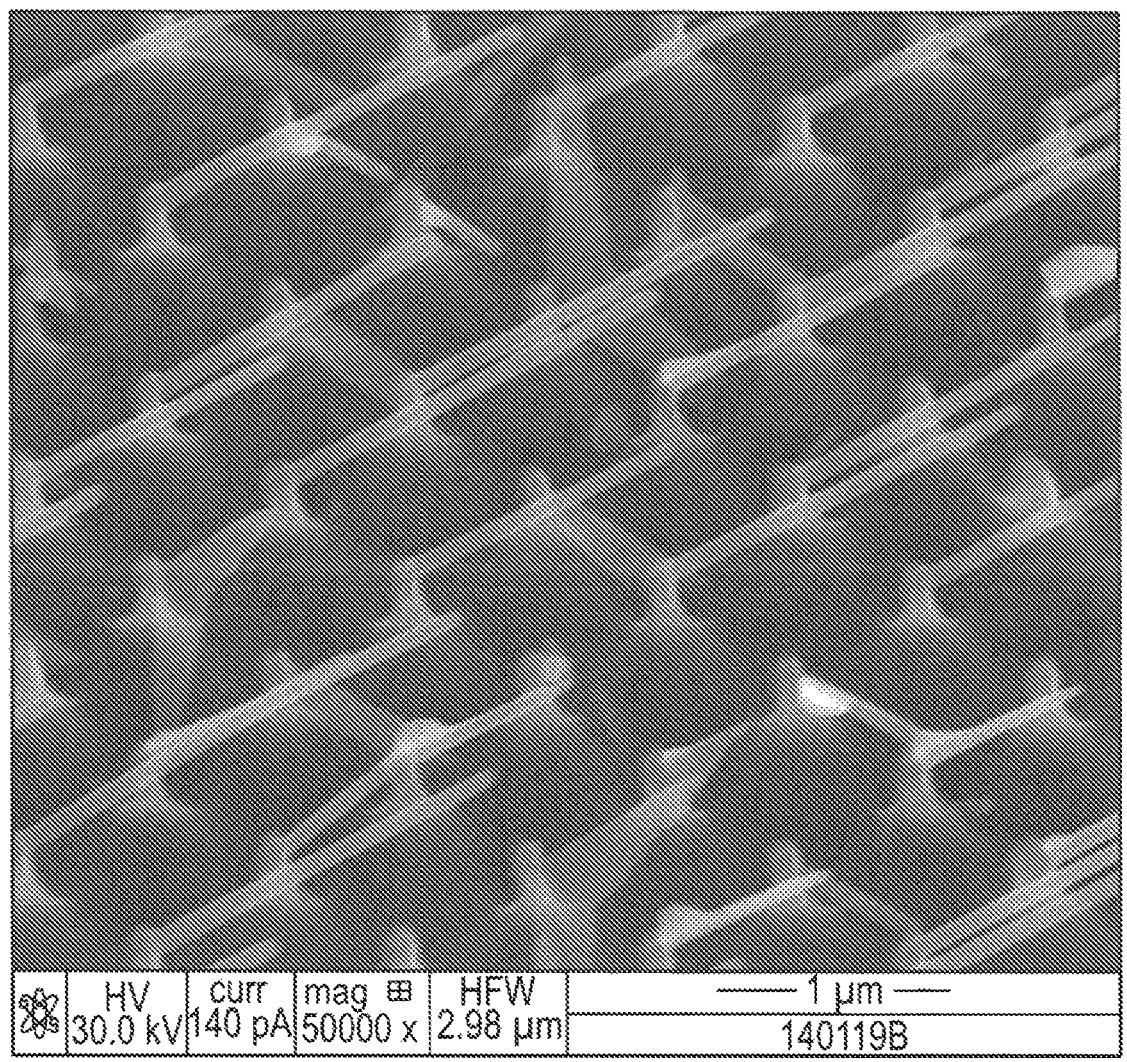
FIG. 4C is an SEM image of an array of InAs nanowires grown on a Si(001) substrate according to the process depicted in FIGS. 1A-1G. Most of the nanowires are aligned to a single direction. All nanowires are as-grown without bending, corresponding to the dashed nanowire in FIG. 2.
Figure 5A:
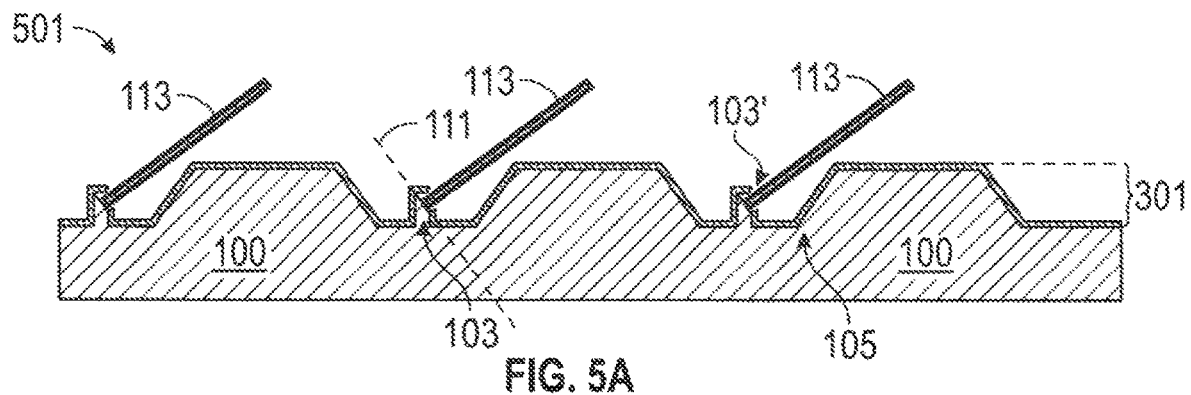
FIGS. 5A-5E depicts a process for simultaneously bending a plurality of nanowires according to an embodiment. In this embodiment, a mask is pressed onto a plurality of nanowires causing them to bend such that free ends of the nanowires are affixed, via Van der Waals forces, to a substrate surface.
Figure 5B:
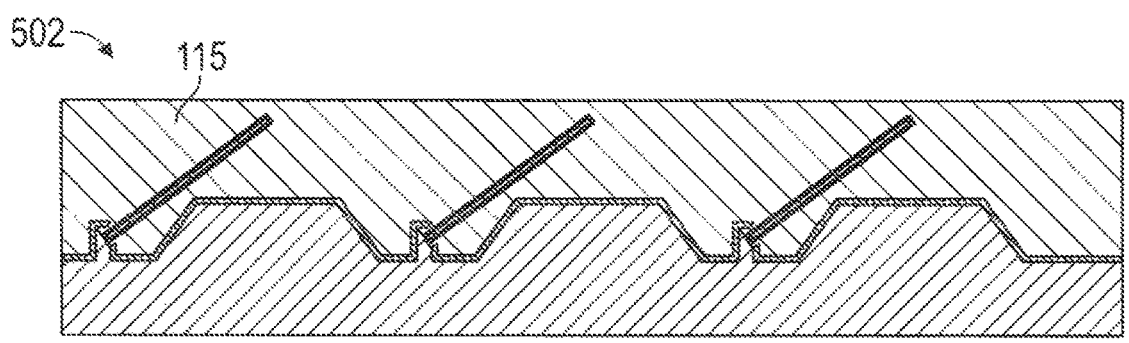
Figure 5C:
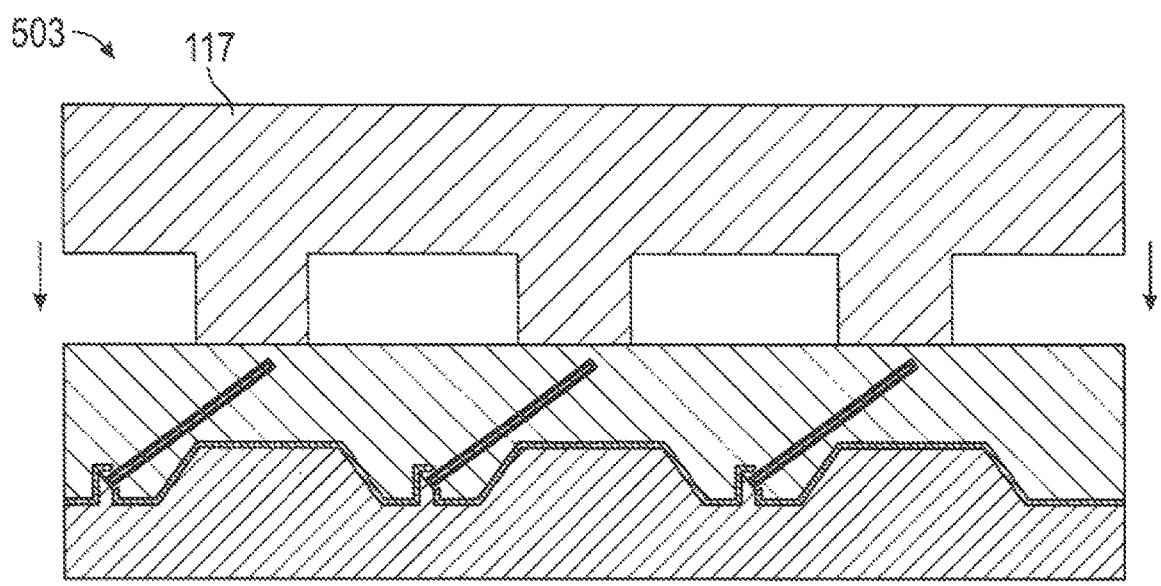
Figure 5D:
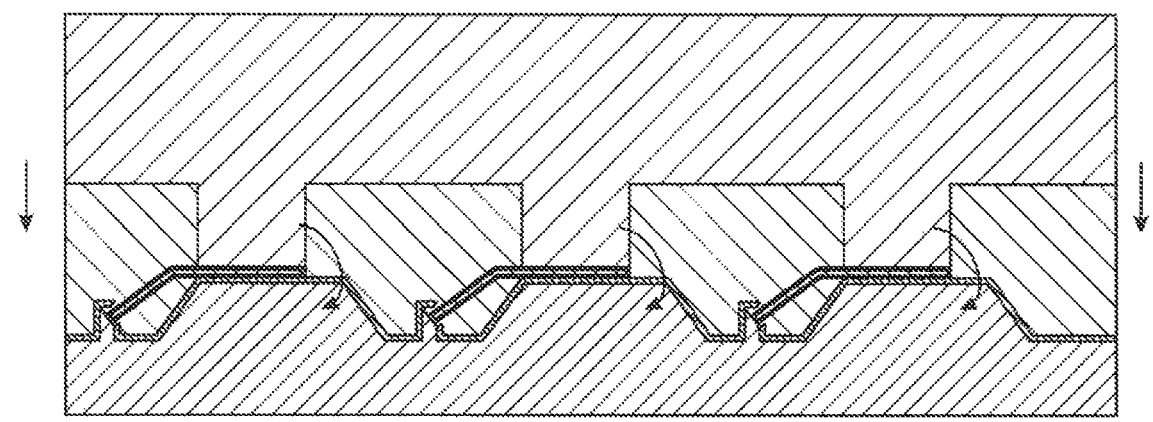
Figure 5E:
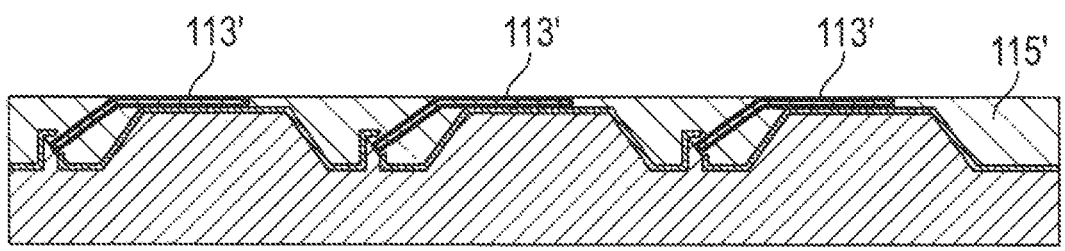
Figure 6A:
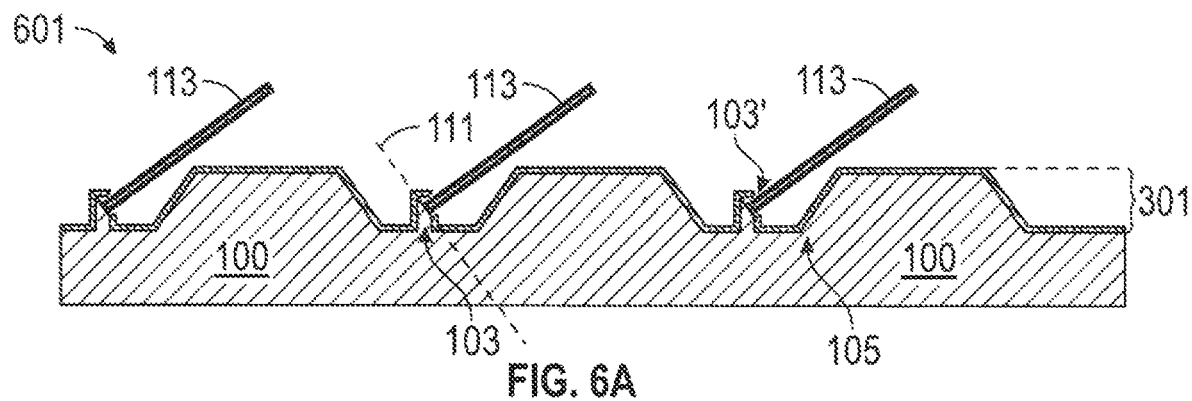
FIGS. 6A-6F depicts a process for simultaneously bending a plurality of nanowires according to an embodiment. In this embodiment a mask is pressed onto a plurality of nanowires causing them to bend such that free ends of the nanowires are affixed to a substrate surface and a subsequent deposition step is used to anchor the nanowires to the substrate.
Figure 6B:
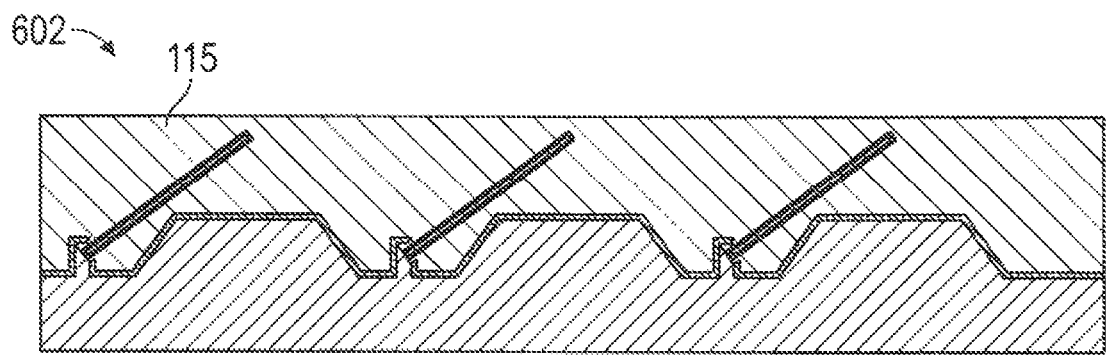
Figure 6C:
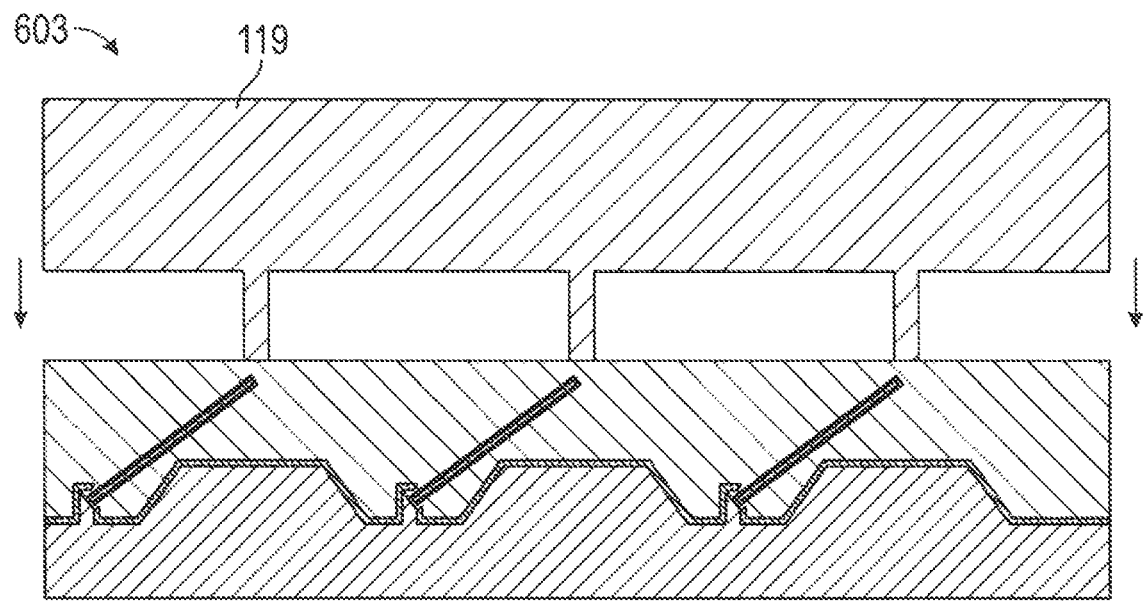
Figure 6D:
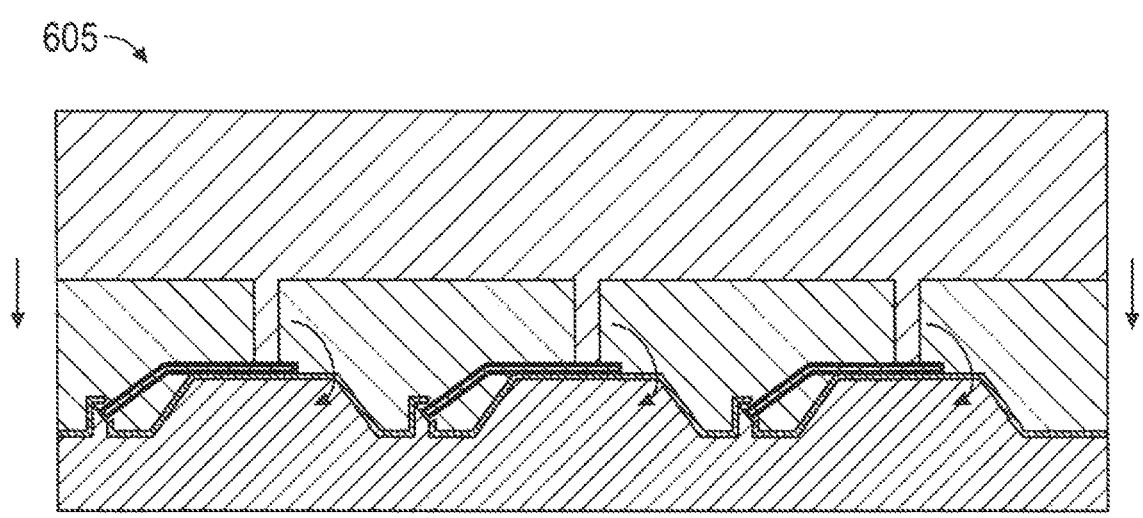
Figure 6E:
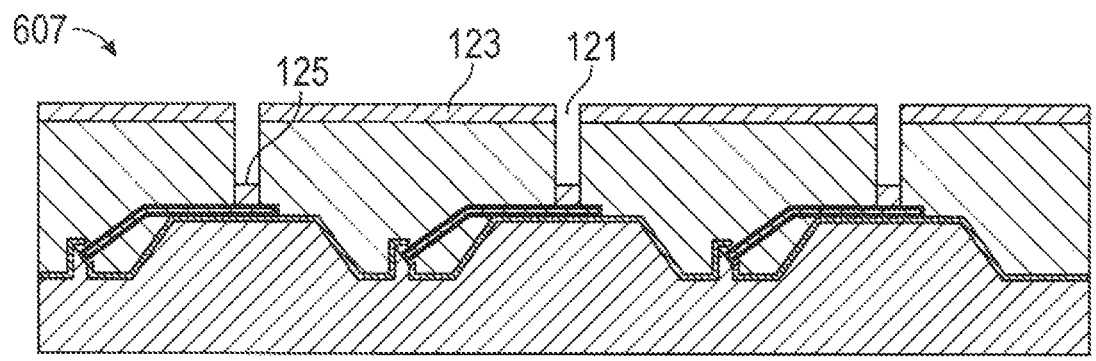
Figure 6F:
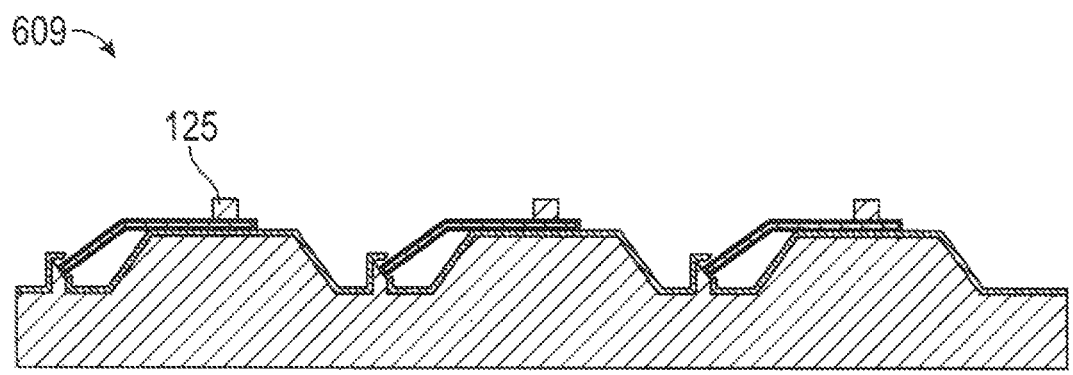

FIG. 4A shows top-down view scanning electron microscopy (SEM) images of an passivated support structure in the form of a pillar with a side hole opening at the right side (top) that corresponds to the top of FIG. 1G and an nanowire grown from it (bottom) that corresponds to the top of FIG. 1H. That is, FIG. 4A shows top-views of a support structure covered with dielectric coating ($SiO_2$) except at a sidehole (top panel) through which an InAs NW is formed (bottom panel). FIG. 4B is an SEM image that shows the result of bending the nanowire onto a nearby $SiO_2$ surface by mechanical pressing with a photoresist film. FIG. 4C shows an array of nanowires as-grown on nanowire growth surfaces of pillar-shaped support structures (an array of support structures).

Alternatively, in place of the plurality of posts described in connection with FIG. 4A, a set of continuous ridges can be formed in the silicon substrate and lithography processes can be used to define a plurality of holes in the various coatings leading to localized growth surfaces for a plurality of nanowires, such as described for FIGS. 7A-7F below.

Nanoimprinting, such as shown in FIGS. 5A-5E and FIGS. 6A-6F may be used for bending the nanowires. For example, FIGS. 5A-5E depicts a process for simultaneously bending a plurality of nanowires according to an embodiment. In this embodiment, at 501 an array of nanowires 113 are formed on nanowire growth surfaces 103' of support structures 103 on substrates comprising a plurality of steps. The nanowires may be grown according to the process depicted in FIGS. 1A-1H or FIGS. 2A-2J. At 502, an imprint coating 115 is formed over the substrate and nanowires. At 503, a nanoimprinting stamp 117 may be aligned over the polymer imprint coating 115. The nanoimprinting stamp 117 may include protrusions that can extend from a body portion of the stamp. At 504, a force (indicated by the downward pointing arrows) may be applied against the nanoimprint stamp 117 to drive the nanoimprint stamp's protrusions into the polymer coating and onto the plurality of nanowires 113. The plurality of nanowires is caused to bend (as indicated by the curved arrows). The nanoimprint stamp 117 may be removed and excess portions of polymer imprint coating 115 may be removed, for example, via dry etching, leaving the free ends of the nanowires affixed as shown at 506 in FIG. 5E, via Van der Waals forces, at a surface of the substrate. As another example, the surface tension forces can be configured to act on a subset (including the entire set as an option) of the as-grown array of nanowires.

FIGS. 6A-6F depicts an alternative process for simultaneously bending of a plurality of nanowires. In this embodiment a nanoimprinting stamp is pressed onto a plurality of nanowires causing them to bend such that free ends of the nanowires are affixed to a substrate surface and a subsequent deposition step is used to form an anchor on the nanowires to keep the nanowires in contact with the substrate. In this embodiment, at 601 an array of nanowires 113 are formed on nanowire growth surfaces 103' of support structures 103 on substrates comprising a plurality of steps. The nanowires may be grown according to the process depicted in FIGS. 1A-1H or FIGS. 2A-2J. At 602, an imprint coating 115 is formed over the substrate and nanowires. A nanoimprinting stamp 119 may then be aligned over the polymer imprint coating 115 at 603. The nanoimprinting stamp 119 may include protrusions that can extend from a body portion of the stamp. At 605, a force (indicated by the downward pointing arrows) may be applied against the nanoimprinting stamp 119 to drive the nanoimprint stamp's protrusions into the polymer coating and onto the plurality of nanowires 113. The plurality of nanowires is caused to bend (as indicated by the curved arrows). The nanoimprinting stamp 119 may be removed leaving behind at least one slot 121 through the imprinting coating 115 that extend to the bent nanowires. At 607, a dielectric film 123 may be deposited over the imprinting coating 115 and on the nanowires at portions exposed by the at least one slot 121. At 609 portions of the dielectric film are removed, for example via lift-off, leaving behind some dielectric material on the nanowires which as anchor 125 to keep the nanowire in contact with the substrate. Alternatively, polymer may be formed between the nanowire and the substrate to adhere the nanowire to the substrate. Structurally, NWs enabling gate-all-around (GAA) channel control are strong candidates for TFET as well as for the next generation transistor. In some embodiments described herein, complimentary tunnel field effect transistors (C-TFETs) are implemented with tandem axial p-i-n NWs. For example, a C-TFET comprises a first nanowire formed in a first direction and configured as an n-TFET, and a second nanowire formed in a second direction and configured as a p-TFET, wherein the first and second nanowires may be formed according to methods described herein and may comprise of different materials. Accordingly, an n-TFET nanowire and a p-TFET nanowire may be epitaxially grown on a single substrate (e.g., a single Si(001) substrate) by nanoscale patterned growth (NPG) and may comprise different materials from one another. In an example $In_xGa_{1-x}As$ and $Ge_xSn_{1-x}$ are suggested for n- and p-TFETs, respectively. NPG for dual material NW epitaxy may be achieved on a non-planar Si substrate that is ideally fabricated for the C-TFET by vapor-liquid-solid (VLS) method. Dual material NW epitaxy on a single substrate may be guided by two different metal catalysts (e.g., a first metal and a second metal) spatially separated from each other on a substrate, each with a nanoscale 2-dimensional (2D) alignment on the substrate surface that induce preferential VLS reaction of individual materials depending on metal species and growth temperatures.

FIGS. 7A-7F provides an overview of an embodiment for fabricating a complimentary tunnel field effect transistor (C-TFET), for example, C-TFET pairs. At step 701 depicted in FIG. 7A, a substrate 100 comprises a base portion 101 and a one-dimensional (1D) array of steps 301 comprising preselected facets 702. The base portion 101 and the 1D array of steps 301 may be formed via patterning portions of a bulk substrate or growing on a surface of the substrate. In an example, facets 702 comprise (111)-type facets that are fabricated on a substrate 100 that comprises Si(001). A dielectric coating 105 may be formed on the substrate, including on the surfaces of steps 301, by passivating the surface of the substrate. For example, the surface of a Si(001) substrate may be passivated with a $SiO_2$ film. For example, a Si(001) substrate may be anisotropically etched and then exposed to a surface oxidation. The facets 702 (e.g., (111)-type facets) could be locally of varying lengths and varying density on the substrate to accommodate circuit variations.

Figure 7A:
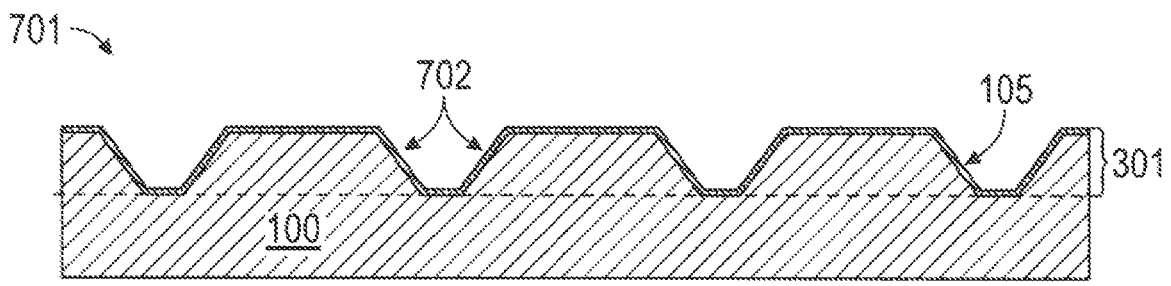
FIGS. 7A-7F illustrates a method of an embodiment in which cross-sectional views of two different material NW arrays periodically grown on (111)-faceted grooves fabricated into a Si(001) substrate with corresponding first and second metal catalysts by a preferential VLS method. Each NW is assumed to be doped longitudinally in the order of $n^+$, i, and $p^+$ during epitaxy to form a tandem p-i-n junction.
Figure 7B:
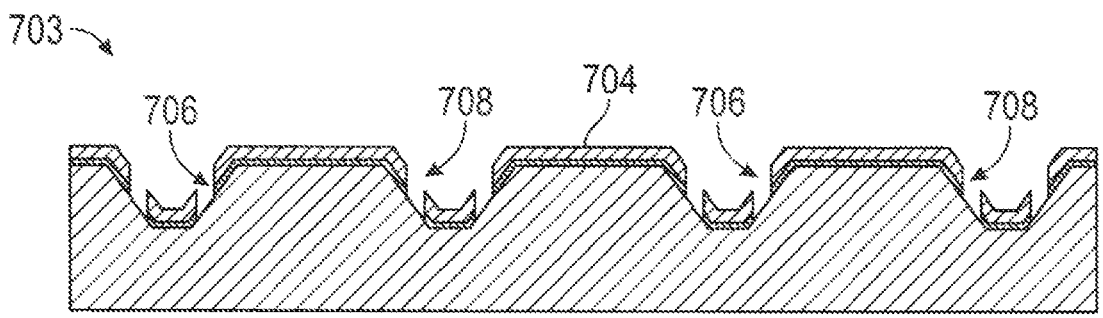

At step 703 depicted in FIG. 7B, a patterning layer 704 may be formed over the dielectric coating 105. An array of holes 706, 708 may be formed as defined by a masking pattern of patterning layer 704 and through the dielectric coating to expose the preselected facets 703. In an example, nanolithography, such as electron e-beam lithography, may be utilized to define the array of holes 706, 708 along each preselected facet (e.g., along (111)). Other lithographic approaches including optical lithography combined with directed self-assembly of diblock copolymers can also be an approach. EUV lithography is an alternative approach. Moreover, as advanced lithographic capabilities become available, they can be adapted for use with the above described process.

Figure 7C:
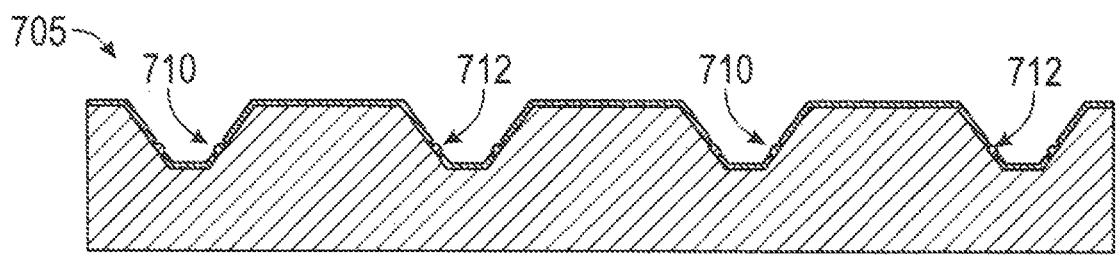

At step 705 depicted in FIG. 7C, metal films may be formed and patterned such that first metal film 710 and a second metal film 712 may be formed on opposing sides of each of the steps 703, such as at first and second sides and at locations defined by holes 706 and 708, respectively. The first and second metal films may be formed by, for example, double deposition at opposing sides of each one of the steps 301 (a first deposition for the first metal and a second deposition for the second metal). These metal films may serve as catalysts for initiating growth, such as vapor-liquid-solid (VLS) growth, in subsequent steps. In an example, selective removal of the $SiO_2$ formed in step 701 and a hydrogen passivation are performed followed by double deposition at glancing angle to form metal films 710,712. In an example, first and second preselected facets 702 (e.g., two (111) facets) opposing to each other at holes 706 and 708 on a single step 301 are covered by different metal films. Here, a first metal and a second metal are optimal to serve as catalysts for preferential VLS growth of first and second nanowires. This means the first metal provides a higher growth rate with the material of a first nanowire than that of second nanowire and the second metal provides a higher growth rate with the material of a second nanowire than that of the first nanowire.

Accordingly, step 705 depicted in FIG. 7C proceeds with a resist lift-off to remove the deposited catalyst metal everywhere except the holes 706 and 708 on the preselected (e.g., (111)) facets 702. A subsequent thermal treatment changes the metal films deposited in the holes into a quasi-spherical globules for the VLS method via melting and surface tension, or by solid-state diffusion and re-crystallization. The amount of metal must be controlled so that a single globule can be generated on the preselected facet, such as the Si(111) surface exposed through the holes. It is noted that even though several small clusters will be formed at the beginning of thermal treatment, they ultimately can be agglomerated into a single seed by Ostwald ripening.

Figure 7D:
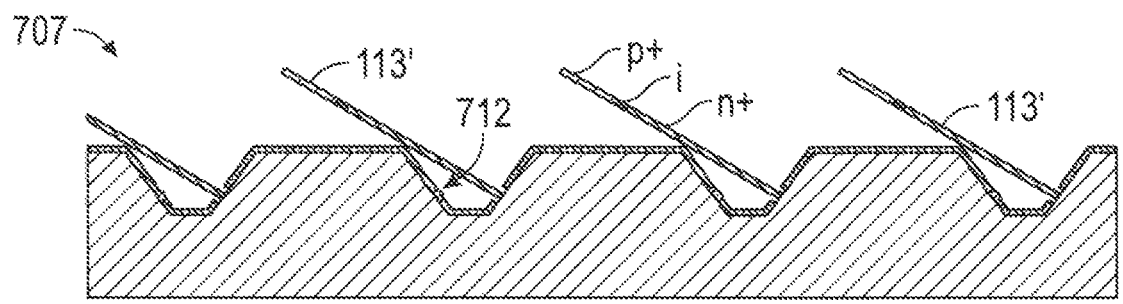

Step 707 depicted in FIG. 7D illustrates epitaxy of a first nanowire 113' by the first metal on a first side of each one of step 301. The epitaxy of the first nanowire 113' may be conducted under a growth condition leading to a preferential VLS reaction that suppresses or lowers the epitaxy for a first nanowire by the second metal.

Figure 7E:
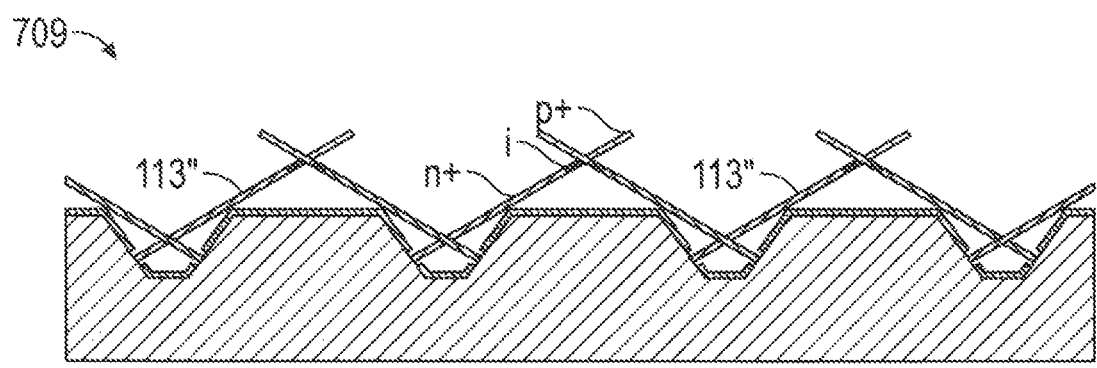

Step 709 depicted in FIG. 7E illustrates epitaxy of a second nanowire 113" by the second metal on a second side of each one of step 301. The epitaxy of the second nanowire 113" may be conducted under a growth condition leading to a preferential VLS reaction that suppresses or lowers the epitaxy for second nanowires by the first metal at the opposing facet of the step 301. For example, in an embodiment, growing the first nanowire may be performed at a first temperature, and the growing the second nanowire may be performed at a second temperature. The first temperature may be different from the second temperature. In an embodiment, growing the first nanowire, the second nanowire, or both may be performed by metalorganic chemical vapor deposition (MOCVD). Thus, growing the first nanowire by MOCVD may be performed at a first temperature, first pressure, in a first gas environment, or combinations thereof; the growing the second nanowire by MOCVD may be performed at a second temperature, a second pressure, a second gas environment, or combinations thereof. In the case of nanowire growth by MOCVD, the first temperature may be different from the second temperature, the first pressure may be different than the second pressure, and/or the first gas may be different than the second gas. In an embodiment, growing the first nanowire, the second nanowire, or both may be performed by molecular beam epitaxy (MBE). Thus, growing the first nanowire by MBE may be performed at a first temperature, first pressure, with first atoms, or combinations thereof; the growing the second nanowire by MBE may be performed at a second temperature, a second pressure, with second atoms, or combinations thereof. In the case of nanowire growth by MBE, the first temperature may be different from the second temperature, the first pressure may be different than the second pressure, and/or the first atoms may be different than the second atoms. The first nanowire, the second nanowire, or both the first nanowire and second nanowire may be heterostructured nanowires that comprise group III-V, group II-VI, group IV, or oxide materials with longitudinal and/or transverse growth variations.

In an example, the first nanowire 113' may comprise $In_xGa_{1-x}As$ and the second nanowire 113" may comprise $Ge_xSn_{1-x}$. For the first metal and the second metal, two corresponding materials, Zn and Ga can be used, respectively, according to the liquid-solid phase diagrams for Ge—Zn and In—Ga alloys, as an example, where the supersaturation of Ge and In required for VLS method is available in the globules alloyed with catalyst metals. The first and second metal catalysts proposed here are based on the phase diagrams of individual catalyst metal-NW material mixtures. There could be other optimal combinations with the given materials for NW growth along with the consideration of the vapor pressure of metal catalysts. The supersaturation for Ge composition greater than 0.5 in Ge—Ga alloy is available around 950 K while that for In composition at the same range in In—Ga alloy can be achieved near 330 K. Depending on its vapor pressure, Ge can maintain a supersaturation state in Ge—Zn alloy. On the contrary, the supersaturation of In in In—Zn alloy may not be available in liquid phase at both given temperature. Assuming that the growth rate of Ge and InAs in VLS method with the given catalyst is reasonably finite for the composition ~0.5 and roughly proportional to the difference of their individual composition between supersaturation and equilibrium state, the growth rate of Ge could be much lower than that of InAs around 330 K with Ga catalyst and vice versa near 950 K depending on their vapor pressure. This means Ga is a plausible metal catalyst exclusively for InAs growth around 330 K and does not contribute to the growth of GeSn growth if its growth temperature is kept considerably below 950 K. The higher temperature growth would be performed first to avoid the sublimation of the first-grown NWs in the growth of the second NWs. Also, Zn can play a role of a metal catalyst only for Ge, implying very low growth rate of InAs with Zn. This explains preferential VLS method along the variation of growth temperature and metal catalyst available at the site of each metal. If their preferentiality depending on metal catalyst is sufficiently pronounced at the same growth temperature, the sequential growth of first and second nanowires in FIGS. 7D and 7E can be replaced by a simultaneous growth. The VLS method for binary alloys such as $In_xGa_{1-x}As$ and $Ge_xSn_{1-x}$ is available on the same basis. Eventually, dual metal catalysts for epitaxy of first and second nanowires, each comprising different materials, on a single substrate by preferential VLS method is highly advantageous in case such materials are not available with practical growth rates at different growth temperatures under a single metal catalyst and the location of the first and second NWs must be spatially separated from each other for their different physical properties in epitaxy and device processing/performance.

Alternatively, Au and Sn are assumed as first and second metal catalysts for $In_xGa_{1-x}As$ and $Ge_ySn_{1-y}$, respectively. Typical growth temperature of $In_xGa_{1-x}As$ with Au catalyst is ~500° C. while that for $Ge_ySn_{1-y}$ with Sn speculated from the liquid-solid phase diagram of Ge—Sn alloy and the reported data for its epitaxy would be ~160° C. Since both Ga—Sn and In—Sn alloys are in liquid state around 500° C. regardless of their composition, that is, far above their eutectic points, no VLS growth happens at the site of an Sn droplet and the epitaxy of $In_xGa_{1-x}As$ proceeds mainly at the site of Au when the precursors for this NW are supplied to a reactor. On the other hand, 160° C. is lower than the eutectic points of Ge—Au and Sn—Au alloys. This implies that the materials would be in solid state for all compositions during the subsequent growth of $Ge_ySn_{1-y}$ by the precursors for Sn as well as Ge, and Au doesn't play a significant catalytic role. This assumes the absence of vapor-solid-solid (VSS) processes and insignificant vaporization of Sn during growth of $In_xGa_{1-x}As$ at ~500° C. If the vaporization is noticeable, additional amount of Sn to compensate it can be considered in its deposition before epitaxy. In the phase diagram, $Ge_ySn_{1-y}$ only with y very close to 1 would be available as a solid alloy in this VLS and the precursor for Sn may need for smaller y ~0.92 to achieve direct bandgap required for high tunneling probability in TFET.

The sequential growth of first and second nanowires relies on their different reaction (or growth) rates at respective ones of first and second metal catalysts. If the growth rate difference is not significant, certain growth of the first nanowire 113' at the site of the second metal would be inevitable during growth of the first nanowire 113' at the site of first metal, and vice versa. But this does not disturb the practical device structures in individual NWs seriously since the former (i.e, first nanowire grown at the site of second metal before growth of the second nanowire would be located at the root of the second nanowire), and the latter (i.e., the second nanowire grown at the site of metal 1 after growth the first nanowire is near the tip of the first nanowire, which could be easily excluded from the actual device region during the device formation processes. This insensitivity provides additional degrees of freedom in choosing metal catalysts.

Figure 7F:
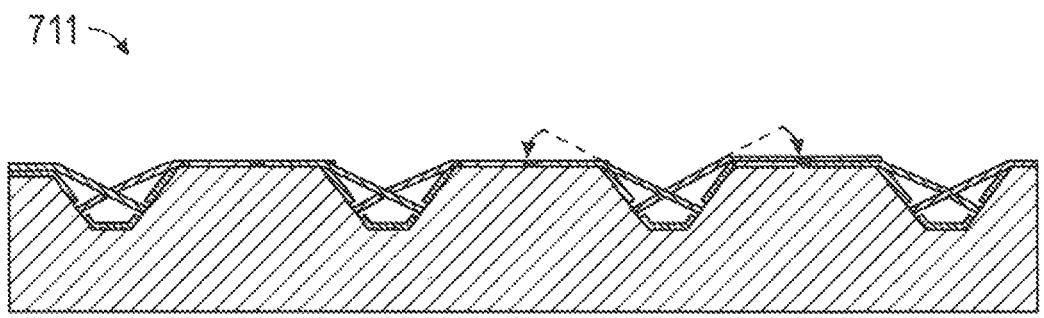

Step 711 as depicted in FIG. 7F shows bending of NWs to the adjacent Si(001) facets as indicated by the curved arrows. In an embodiment, the bending is elastic bending. In an embodiment, bending may be achieved as described above for FIG. 1G, FIG. 2J, FIG. 3, FIGS. 5A-5D, and FIGS. 6A-6F.

In summary, in an embodiment at least one of a first nanowire and at least one of a second nanowire are epitaxially grown on (111) facets of a substrate in opposing directions. The nanowires may be grown in a groove or hole fabricated through a dielectric coating formed on the substrate (e.g., a Si(001) substrate) by VLS method. The grooves can be complete, e.g. a V-groove, or the grooves can be flat bottomed (i.e., flat-bottomed grooves). The nanowires undergo physical bending for a planar device process that leads to horizontally disposed NWs on the substrate surface (e.g., a Si(001) surface), directly compatible with conventional CMOS technology. In other words, in an embodiment, first and second nanowires grow on a Si(001) substrate along <111> but are forced to lie on the substrate for planar device processing by postgrowth bending. The <111> direction is the optimal direction for nanowire fabrication, but is not CMOS compatible. The bending process, provides a simple technique to both grow the nanowires along <111> and to fabricate transistors in a planar process on a Si(001) substrate. This process combines the advantages of thickness control and doping profile available to vertical NWs on (111) while also enabling the application of established planar CMOS processing on (001).

Figure 8:
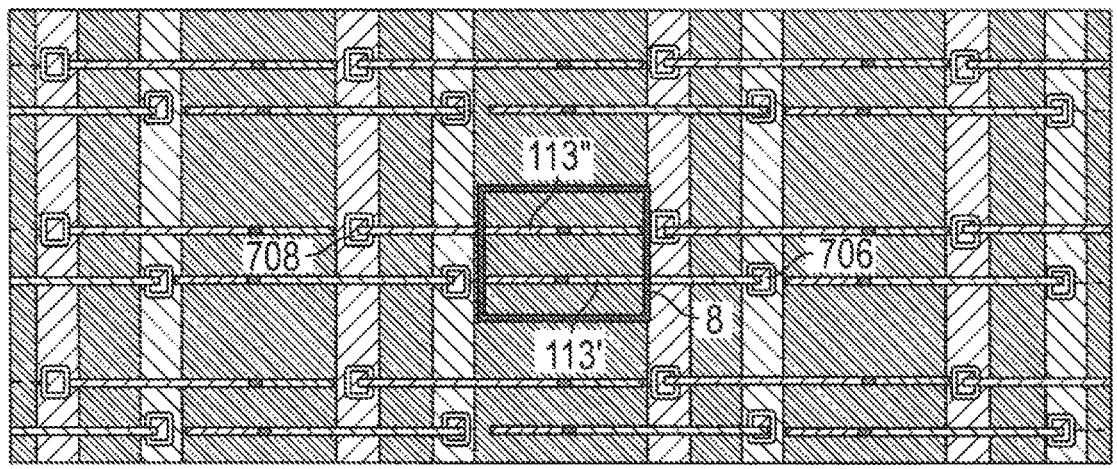
FIG. 8 is a top-down view of FIG. 7F.

FIG. 8 is a top-down view illustration of FIG. 7F that shows a 2D array of paired ones of first nanowire 113' and second nanowire 113", as indicated by a box 8. In FIG. 8, a pair of first and second nanowires 113', 113" are oppositely grown on preselected facets (e.g., (111) facets) from a semiconductor-on-insulator (SOI) structure on a $SiO_2$ film of a Si(001) substrate. VLS allows a non-tapered, small-diameter, tandem longitudinally doped nanowire with a well-defined single (111) facet at a root end portion of the nanowire during epitaxy that is perpendicular to the nanowire growth direction. With the (111) facet, nanowires of the embodiments may comprise abrupt doping profiles, for example, across a ~10 nm-thick, undoped i-region between a p+ and an n+ region, for source and drain, respectively. Doping must be controlled so that band-to-band tunneling (BTBT) is available from one heavily doped region to the other through the i-region controlled by the gate voltage. Physical bending by, for example, nanoimprinting to lay down all NWs at the top of corresponding nearby steps of a substrate; causes strain to be induced with the strain being strongest over grooves/gaps disposed between steps which can be reduced or eliminated in the junction regions.

Figure 9A:
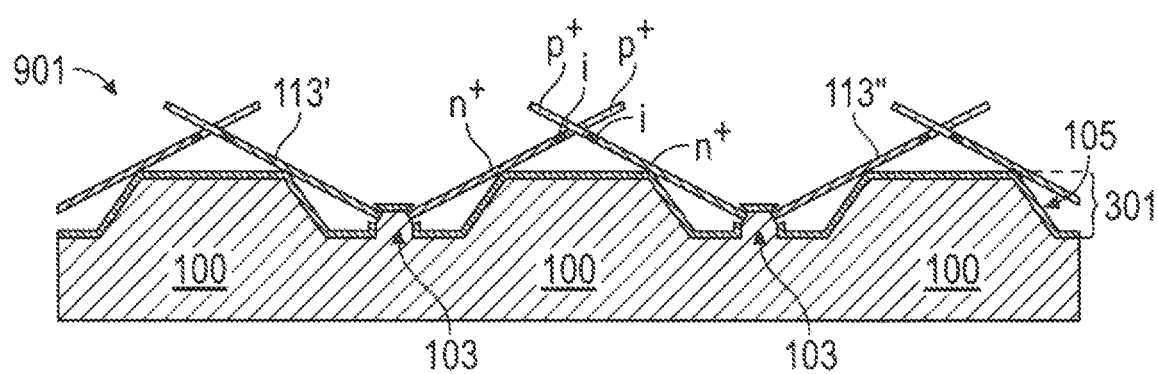
FIGS. 9A-9B depict another method of an embodiment for growth of two different material NW arrays grown on an array of pillar-shaped support structures having (111) facets formed at opposing sides of the support structures on (111) facets according to the same process as the NW arrays illustrated in FIGS. 7A-7F. Here, FIGS. 9A and 9B correspond to the steps illustrated in FIGS. 7E and 7F.
Figure 9B:
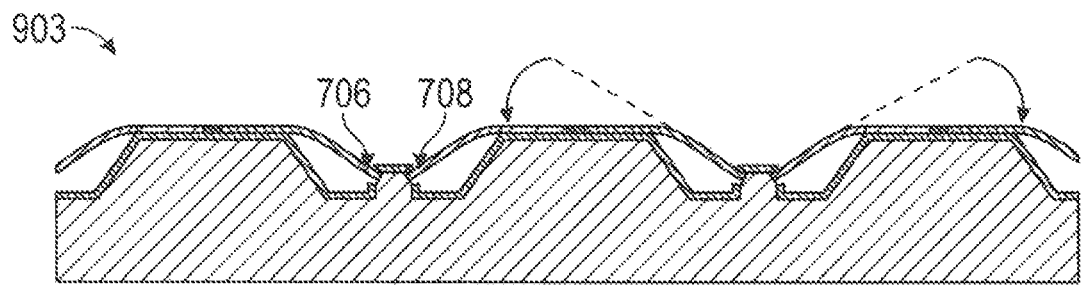
Figure 9C:
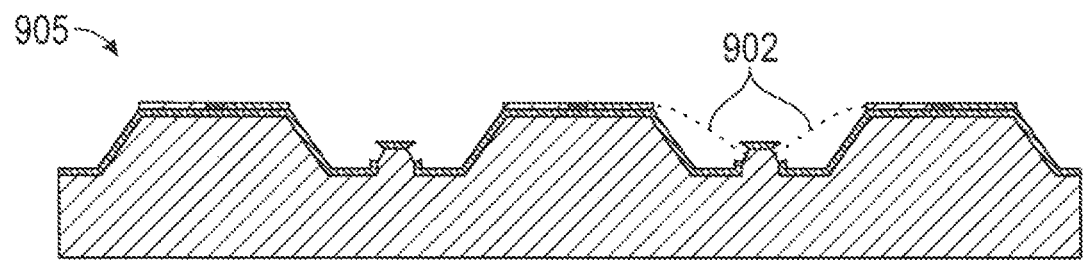
FIG. 9C depicts the removal of NW roots to isolate NWs electrically and mechanically from the substrate.

It is noted that nanowires 113' and 113" may also be grown according to the methods described above and depicted in FIGS. 1A-1H, and FIGS. 2A-2J. Accordingly, in a method for forming nanowires depicted in FIGS. 9A-9C, fabrication picks up at step 901 (FIG. 9A) which is similar to the fabrication step shown in FIGS. 1H and 2J, except that two openings instead of one opening are formed in a support structure 103 through which first nanowire 113' and second nanowire 113" are formed. Bending of the nanowires is shown at FIG. 9B as step 903. Nanowire bending can result in an array of NWs with opposite doping sequence longitudinally arranged in individual NWs along each step. Additionally, at step 905 in FIG. 9C, a root end 112 of the nanowires may be removed at 902 in order to separate the nanowires from the support structures 103, for example, at corresponding ones of nanowire growth surfaces formed on the support structures.

In an embodiment, a complimentary tunnel field effect transistor (C-TFET), comprises: a semiconductor substrate having at least two opposing (111)-type facets; a first nanowire comprising a root end and a free end, the root end extending from a first of the at least two opposing (111)-type facets and the free end disposed over an (001) surface of the substrate; and a second nanowire comprising a root end and a free end, the root end extending from a second of the at least two opposing (111)-type facets and the free end disposed over the (001) surface of the substrate; wherein the first nanowire comprises a first material and the second nanowire comprises a second material, and wherein the first and second nanowires are each longitudinally doped and comprise first and second p-n or p-i-n structures, respectively.

In an embodiment, a method for fabricating a C-TFET, comprises: providing a (001) semiconductor substrate; exposing at least two opposing (111)-type facets of the substrate; passivating a surface of the substrate with a dielectric film, the dielectric film disposed over the at least two opposing (111)-type facets, forming an array of holes through the dielectric film, the holes exposing the at least two opposing (111)-type facets; depositing a first metal on a first one of the (111)-type facets; depositing a second metal on a second one of the (111-type) facets; growing a first nanowire on the first one of the (111)-type facets at a first growth condition wherein the first metal serves as a growth catalyst for the first nanowire, the first nanowire comprising a root end and a free end extending from the root end; growing a second nanowire on the second one of the (111)-type facets at a second growth condition wherein the second metal serves as a growth catalyst for the second nanowire, the second nanowire comprising a root end and a free end extending from the root end; and physically bending each of the first and the second nanowires such that at least a portion of a surface of their free ends contact an (001) surface of the substrate.

Figure 10A:
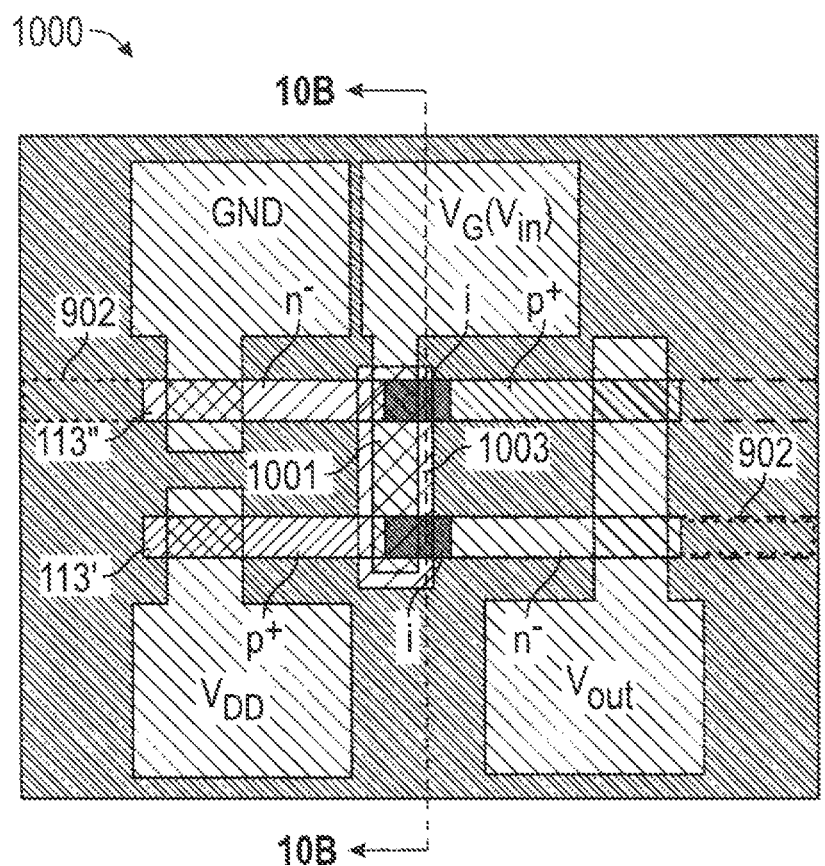
FIGS. 10A-10B show an inverter designed with a pair of NWs such as those in the box included in FIG. 8 with top-down view (FIG. 10A) and cross-sectional view (FIG. 10B) along line 10B-10B in FIG. 10A.
Figure 10B:
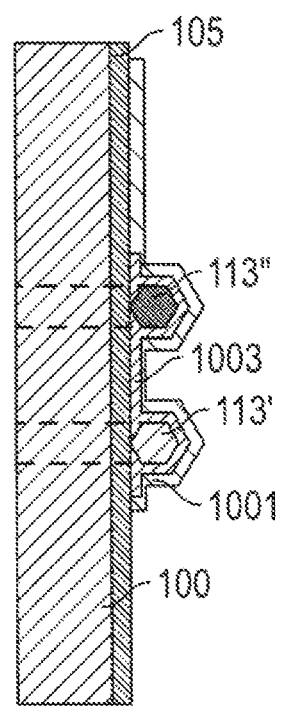

FIGS. 10A-10B are top and cross-sectional side views of a GAA C-TFET inverter 1000, as an example of a logic circuit, fabricated with two adjacent ones of first and second nanowires 113', 113" that each comprise p-i-n doping profiles, such as those in box 8 in FIG. 8. In an embodiment, the GAA C-TFET comprises a Si substrate 100, a SiO$_2$ dielectric coating 105 formed over the substrate, an InGaAs first nanowire 113' as a p-TFET and a GeSN second nanowires 113" as an n-TFET formed on the dielectric coating 105, a ground electrode (GND) in electrical communication with the n-doped region of the second nanowire 113", a gate electrode (V$_G$) in electrical communication with the intrinsic regions of both first and second nanowires 113' and 113", a source electrode (V$_{out}$) in electrical communication with the n-doped regions of the first nanowire 113' and in electrical communication with the p+ doped-region of the second nanowire 113", and a drain electrode (V$_{DD}$) in electrical communication with the p+-doped region of the first nanowire 113'. A GAA oxide 1003 may be formed over intrinsic region of the first and second nanowires 113' and 113", respectively and gate electrode 1001 may be formed over the gate electrode.

The nanowire based C-TFET depicted as formed according to the methods described in FIGS. 7A-7F and FIGS. 9A-9C, and as shown in FIGS. 10A-10B, resolves several problematic issues in comparison with existing techniques. First, it is planar on Si(001) and therefore directly accommodated into mature CMOS technology. No pick-up and relocation of individual NWs are required and scaling to VLSI densities is straightforward. The bent NWs on the SiO$_2$ film employed for selective VLS form a SOI structure and thus negligible current leakage to the substrate is expected. Depending on post period and NW spacing, more than 10$^{10}$ devices/cm$^2$ are easily achievable. Second, C-TFET that is ideally designed with first and second different NWs formed individually for a p- and n-TFET, respectively, can be implemented on a single Si(001) substrate, providing an improved performance for both complementary devices compared with conventional Si-CMOS. Third, C-TFETs of the embodiments are free from the degradation by the lattice mismatch to Si since the actual NW part used for device is separated from the NW/Si interface. By removing the root region of each NW after bending, as illustrated in, for example, FIG. 9C, and as indicated by a dashed parts in FIG. 10A, the device is completely isolated from the substrate and from any lattice mismatch induced defects near the NW/Si interface at the nanowire growth surface of the substrate. Then, the material advantages from In$_x$Ga$_{1-x}$As and Ge$_x$Sn$_{1-x}$ mentioned above are highly enhanced and directly projected onto the performance of TFET over Si. Furthermore, these binary alloy TFETs can be replaced by heterostructures or quantum well TFETs such as In$_x$Ga$_{1-x}$As/InAs and Ge$_x$Sn$_{1-x}$/Ge for better device performance. While the intrinsic region under the gate is in a planar NW, it is epitaxially grown with a precise thickness control along <111> before bending, like a vertical NW. Such structural advantage provides highly predictable device characteristics with well-defined doping profiles. By sequential growth of NWs with different metal catalysts, doping level of each NW, particularly longitudinally, can be individually controlled to optimize the device characteristics for different applications. Also, III-V, II-VI, and other group IV materials are available for heterostructured NWs for improved tunneling characteristics. For example, the heterostructures can be formed along the length of the nanowires by, for example, changing the material or core-shell surrounding the nanowires with different materials. Finally, devices and methods described herein dramatically simplify the GAA process that is extremely complicated in vertical NW FETs especially for C-TFET and also metallization as a single-level process. Ultimately, the methods described herein improve process reliability and production yield as well as device characteristics.

Aside from applications such as use in C-TFET, embodiments described herein may be applied to other electronic and optoelectronic NW devices such as detectors, light emitting diodes, laser diodes or their arrays that are required for planar integration into Si microelectronics.

Embodiments of the present disclosure are also directed toward increasing the integration density and enhancing the drain current of tunneling field effect transistors (TFETs) fabricated using epitaxially-grown, defect-free NWs. The NWs provide for high integration density for in-plane NW TFETs and resolve inherent low tunneling current as a result of the low saturation drain current in both vertical and in-plane NW TFETs, for example, by integrating multiple NW sections in parallel. This capability provides a benefit over current Si C-MOS. The starting point is an NW epitaxially grown along [111] on a v-shaped groove (or a pillar) fabricated into a Si(001) substrate that, after initiating growth thereof, for example, after growth thereof is complete, is physically bent and brought into physical contact with the substrate, for example, directly placed on a plateau of the original substrate to form an in-plane NW. Multiple nanowires can be fabricated with a single growth process as described above. The density is limited only by the lithography used to define the NW seeds.

Examples of the present disclosure are directed to transforming an epitaxial NW into a serial array of segmented sub-NWs with minimal lengths, set by device considerations, using standard patterning/etching processes and known epitaxial growth methods. This increases the number of devices available from nanowire growth surfaces of corresponding ones of a single v-groove (or a pillar), and is directly related to integration density. By arranging these sub-NWs electrically in parallel, the effective cross section for tunneling current attainable by a single NW can be dramatically enhanced.

FIGS. 11A to 11E illustrate such a process for forming a serial array of segmented sub-NWs from a NW grown according to embodiments of the present disclosure. While the descriptions of FIGS. 11A to 11E are provided with respect to an n-type TFET, the embodiments are not so limited and the methods depicted in FIGS. 11A-11E can be applied for forming a p-type device as well, and to complementary TFET circuits. As discussed above, the NW of embodiments can be any of group IV, III-V, or II-VI semiconductors, as well as any materials which can be grown in NW shape by epitaxy. Additionally, while the substrate surface is passivated with a dielectric film such as $SiO_2$ for electrical isolation of the NWs, other dielectric materials may be used depending on, for example, the substrate material. Further, an while an Si(001) substrate is assumed other materials can also be used in the examples described herein as would be appreciated by of ordinary skill in the art.

Figure 11A:
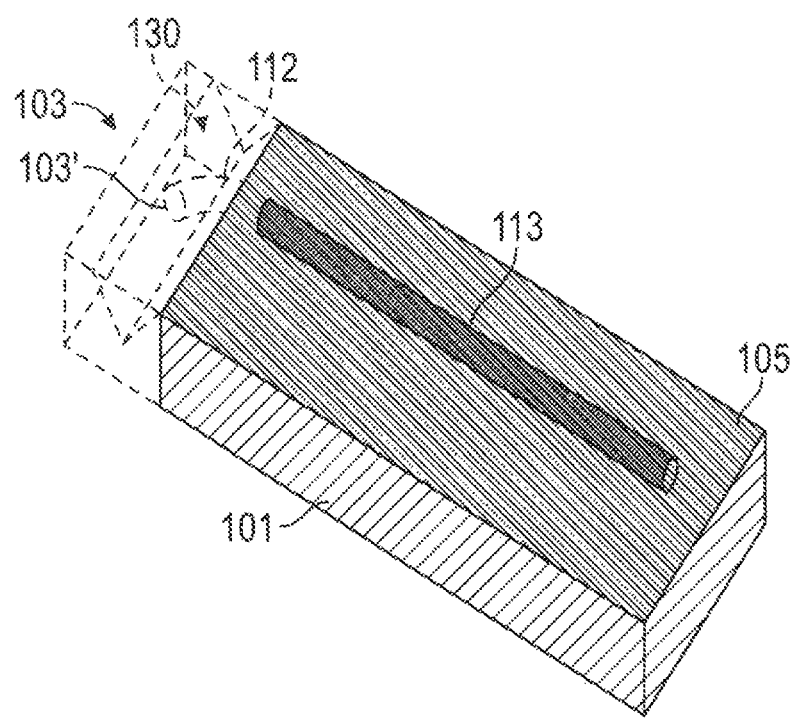
FIG. 11A is an illustration of an NW that has been bent to a Si(001) surface such as shown in FIG. 3.

FIG. 11A is an illustration of an NW 113 that has been bent to be at least partially parallel with and in contact with a surface of a dielectric coating of a substrate 100 surface (e.g., wherein the substrate comprises Si(001)). The NW 113 may be formed according to any method described above and depicted in FIGS. 1A-1H, 2A-2J, FIGS. 5A-5G, FIGS. 6A-6F, FIGS. 7A-7F and FIGS. 9A-9C. As shown in FIG. 11A, the root end 112 of the NW 113 is shown as having been removed (as indicated by the dashed lines) because it contains defected material resulting from the lattice mismatch between the substrate 100 and the NW material. In an embodiment, at least a portion of the NW's root end 112 can be removed using a chemical etch processes. Additionally, a top portion of the free end 114 of the NW 113 can also removed in the same process. The gray dashed lines on the left denote a nanowire growth surface 103' on which the NW growth begins, as described above. The dashed lines also depict the original location of the root end 112 of the NW 113 that has been etched away as described. For simplicity of illustration, only a single nanowire is shown. It is understood that multiple nanowires can be grown along the same v-groove 130, with a density limited only by the available lithographic resolution, and that multiple, parallel v-grooves can be spaced across the Si(001) surface.

Figure 11B:
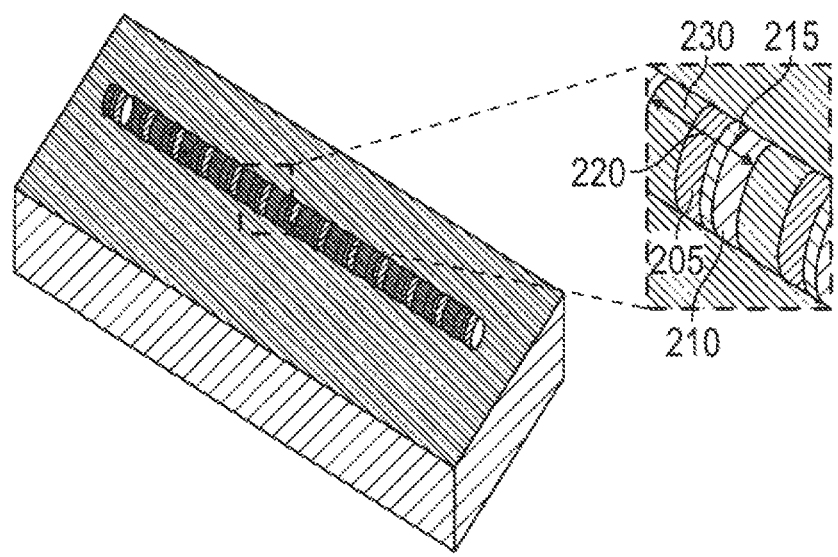
FIG. 11B shows periodic selective doping to form an array of n-type TFETs along the NW of FIG. 11A.

FIG. 11B shows the result of periodic selective doping to form an array of n-type TFETs along the NW 113, according to examples of the present disclosure. As viewed in more detail in the inset of FIG. 11B, ex situ doping with nanolithography periodically defines a drain 205, a source 210, and a tunnel zone 215 between the source and the drain, each with different doping types and concentrations in a single period. Individual periods correspond to the sub-NWs mentioned earlier. Plasma doping, surface (monolayer doping), or low-energy ion-implantation (II) can be used for this purpose. Annealing may be required for dopant activation and recrystallization. In this figure, 12 periods (or sub-NWs) are formed along a length of the NW 113, but the embodiments are not so limited, and the total number of sub-NWs may be changed depending of the specific requirement of target devices and architectures, and available lithographic/etch resolutions. Spacer layers 220 are shown disposed between the sub-NWs. These spacer layers 120 are removed in a later step to allow the access to both ends of the sub-NWs for metallization. Typically the length of this spacer, along the NW, will be at least equal to the NW diameter for structural stability of each sub-NW.

Figure 11C:
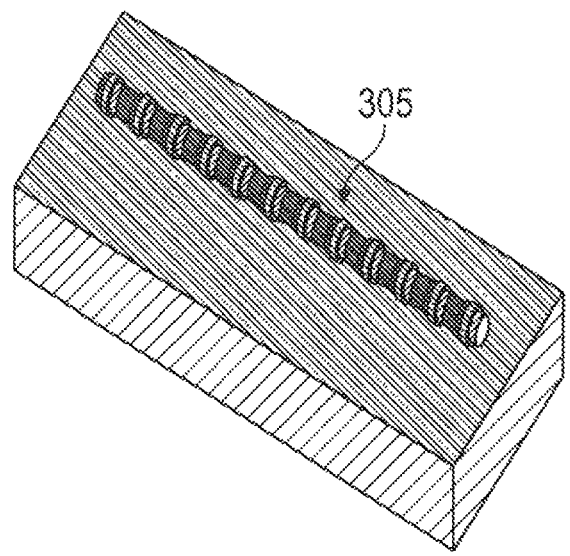
FIG. 11C shows the deposition and fabrication of a gate oxide that passivates the tunnel zone of each period for the structure of FIG. 11B.

FIG. 11C shows the result of deposition and fabrication steps for forming a gate oxide that passivates the tunnel zone of each period, according to examples of the present disclosure. In some embodiments there may be space disposed between the NW and the dielectric coating 105 (i.e., $SiO_2$ film) on the substrate 100. Such space may be the result of residue of thermoplastic polymer embedded between the dielectric coating 105 and the substrate 100 during the bending and/or during contacting of the NW to the substrate as described above attachment process described above (e.g., for example, with respect to FIGS. 5A-5E, and FIGS. 6A-6F). Accordingly, the gate oxide 305 can be formed as an annulus enclosing the NW, with the existing dielectric coating 105 on the Si(001) serving as electrical isolation from the Si substrate surface.

Figure 11D:
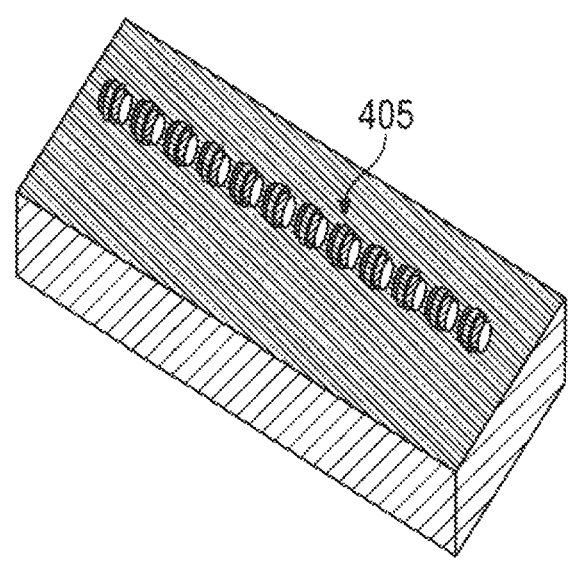
FIG. 11D shows segmentation of the NW of FIG. 11C, and removing spacers formed along a length of the NW in order to produce a serial array of sub-NWs by plasma etching.

FIG. 11D shows a segmentation of the NW, or rather formed by the removing the spacers that produce a serial array of sub-NWs 405 by plasma etching, according to examples of the present disclosure. Depending on the material properties and the compatibility in process flows, the steps illustrated in FIGS. 11B to 11D can be re-ordered between NW segmentation, selective doping, and gate oxide fabrication.

Figure 11E:
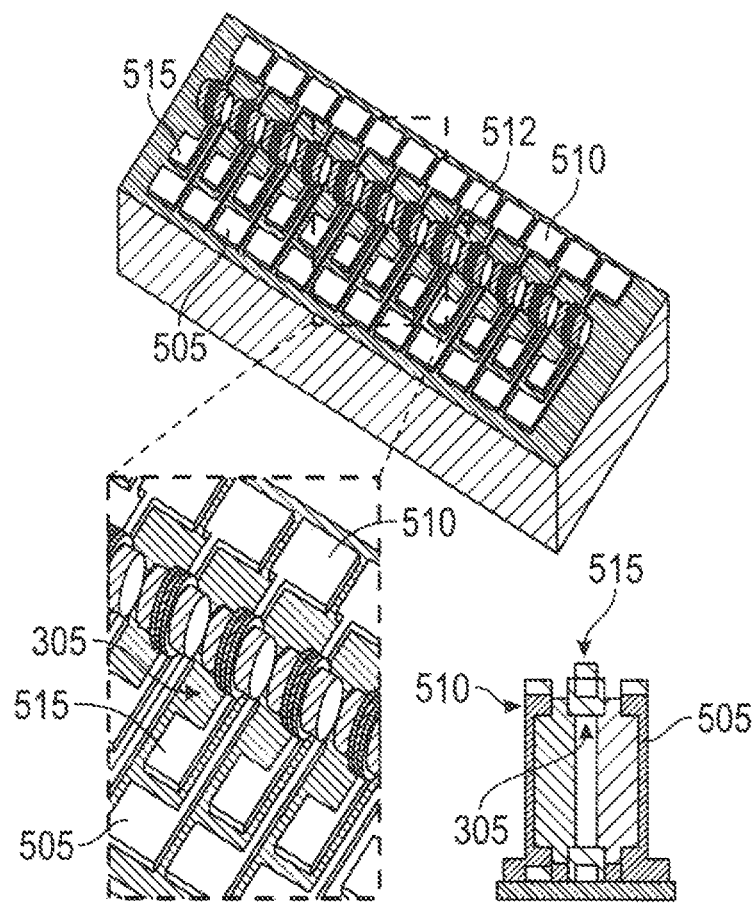
FIG. 11E corresponds to an array of 12 TFETs formed from the serial array of sub-NWs of FIG. 11D.

FIG. 11E shows the metallization process applied to the array of sub-NWs 405 in FIG. 11D. The metallization process includes the deposition and annealing of ohmic metals for source 505 and drain 510 and the deposition of gate metal 515 to form a serial/parallel interconnected array 512 of sub-nanowires, as seen in the zoomed-in view of the inset on the bottom left of FIG. 11E and the cross sectional view of a single sub-NW TFET shown in the inset on the inset on the bottom right of FIG. 11E. As illustrated in this inset, metallization proceeds by covering the etched surfaces revealed by segmentation with ohmic metals so that the damage from the etching can be minimized through the subsequent annealing process. This structure keeps the tunnel zone between source and drain in every sub-NW free from any damage from NW segmentation. Like the gate oxide in FIG. 11C, the gate metal in FIG. 11E can be an annular or may cover at least three sides of the cross sectional view on the bottom right side of FIG. 11E to provide for complete shut-off of the tunneling current. In this case, the nanowire 113 may be doped, for example, longitudinally and/or axially depending on the need.

FIG. 11E corresponds to an array of 12 sub-NW structures 405 in the form of TFETs, according to examples of the present disclosure. However, the embodiments are not so limited and may comprise any particular number of sub-NW structures. This means a single NW 113 grown from a v-groove comprising a preselected facet (or a pillar-shaped structure having a preselected facet formed thereon) can be used for forming multiple sub-MW structures 405 in the form of TFET devices. Accordingly, integration density of devices may be significantly higher than that of v-grooves which occupy a certain portion of the substrate area for NW epitaxy. The highest number of sub-NWs available from a single NW formed according to embodiments primarily depends on the resolution of lithography and the depletion region widths from the doping profile across a sub-NW that determines the minimal sub-NW length for device operation. The configuration in FIG. 11E is for high integration density.

Figure 11F:
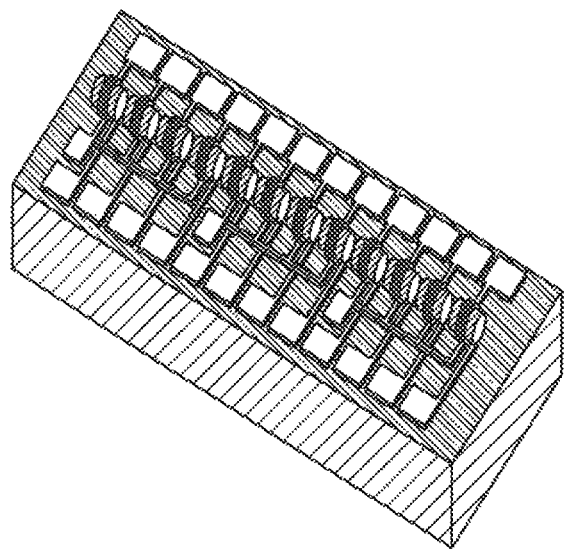
FIG. 11F shows an additional metallization step that results in 3 super-TFETs which individually consist of 4 discrete TFETs formed from sub-NWs connected to each other in parallel.

FIG. 11F is another metallization that results in 3 super-TFETs which individually consist of 4 discrete TFETs from the plurality of sub-NWs 405 that may be connected to each other in parallel, according to examples of the present disclosure. This rearrangement is available from the 12 discrete devices in FIG. 11E. In this metallization, each super-TFET has the cross-sectional area for tunneling current 4× that of a single TFET, implying enhancement of effective drain current. Depending on the requirement of the target device, the number of sub-NWs in a single super-TFET can be varied. This configuration is therefore for larger drain current. Additionally, in other embodiments, there can also be formed multiple nanowires in parallel along a single v-groove as described above, thereby allowing a 2-dimensional array of sub-NWs connected for optimization of specific devices along both NW and v-groove directions.

The embodiments described herein can be applied to other electronic and optoelectronic NW devices such as detectors, light emitting diodes, laser diodes or their arrays that are required for planar integration into Si microelectronics.

While the embodiments have been illustrated respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments will be apparent to those skilled in the art from consideration of the specification and practice of the descriptions disclosed herein. It is intended that the specification and examples be considered as exemplary only, with a true scope and spirit of the embodiments being indicated by the following claims.

What is claimed is:

1. A complimentary tunnel field effect transistor (C-TFET) pair, comprising:

a semiconductor substrate comprising a base portion having a first (001) surface and at least two opposing (111)-type facets;

a first nanowire comprising a root end and a free end, the first nanowire's root end extending from a first of the at least two opposing (111)-type facets and the free end disposed over an (001) surface of the substrate; and a second nanowire comprising a root end and a free end, the second nanowire's root end extending from a second of the at least two opposing (111)-type facets and the free end disposed over the (001) surface of the substrate, wherein the first nanowire comprises a first material and the second nanowire comprises a second material, and wherein the first and second nanowires are each doped longitudinally and comprise first and second p-i-n junctions, respectively.

2. The C-TFET of claim 1, wherein the first material comprises $In_xGa_{1-x}As$.

3. The C-TFET of claim 1, wherein the second material comprises $Ge_xSn_{1-x}$.

4. The C-TFET of claim 1, wherein the first nanowire, the second nanowire, or both nanowires are heterostructured nanowires that comprise group III-V, group II-VI, or group IV materials.

5. The C-TFET of claim 1, wherein the substrate comprises a Si(001) substrate.

6. A method for fabricating pairs of complimentary tunnel field effect transistors (C-TFET), comprising:

providing a (001) semiconductor substrate;

exposing at least two opposing (111)-type facets of the substrate;

passivating a surface of the substrate with a dielectric film, the dielectric film disposed over the at least two opposing (111)-type facets, forming an array of holes through the dielectric film, the holes exposing the at least two opposing (111)-type facets;

depositing a first metal on a first one of the (111)-type facets;

depositing a second metal on a second one of the (111-type) facets;

removing the deposited first and second metals except at locations where the first and second metal have penetrated the array of holes and deposited on the (111)-type facets;

growing a first nanowire on the first one of the (111)-type facets with a first growth condition wherein the first metal serves as a growth catalyst for the first nanowire, the first nanowire comprising a root end and a free end extending from the first one of the (111)-type facets;

growing a second nanowire on the second one of the (111)-type facets at a second growth condition wherein the second metal serves as a growth catalyst for the second nanowire, the second nanowire comprising a root end and a free end extending from the second one of the (111)-type facets;

physically bending each of the first and the second nanowires such that at least a portion of a surface of their free ends contact an (001) surface of the substrate, and fabricating a source, a drain, and a gate contact to connect appropriately to the first and the second nanowires.

7. The method of claim 6, wherein the first nanowire grows in a first direction and the second nanowire grows in an opposing, second direction.

8. The method of claim 6, wherein the exposing comprises forming a one-dimensional array of grooves in the substrate, each of the grooves comprising the two opposing (111)-type faces, wherein the grooves comprise V-grooves or flat-bottom grooves.

9. The method of claim 6, wherein the exposing comprises forming a pillar-shaped support structure that comprises the at least two opposing (111)-type faces.

10. The method of claim 6, wherein the growing the first nanowire is performed at a first temperature, a first gas environment, and the growing the second nanowire is performed at a second temperature, a second gas environment, wherein the first temperature is different from the second temperature and the first gas environment is different from the second gas environment.

11. The method of claim 6, wherein the first nanowire, the second nanowire, or both the first nanowire and second nanowire are doped longitudinally to comprise a p-n, or p-i-n junction along the nanowire.

12. The method of claim 6, wherein the first nanowire, the second nanowire, or both the first nanowire and second nanowire are heterostructured nanowires that comprise group III-V, group II-VI, group IV, or oxide materials with longitudinal and/or transverse growth variations.

13. The method of claim 6, further comprising thermally treating the first and second metals deposited through the holes.

14. The method of claim 6, wherein the first metal and the second metal are deposited using a double deposition with shadowing to separate the two metals on opposite <111> facets.

15. The method of claim 6, wherein the first metal is different than the second metal.

16. The method of claim 6, wherein the substrate comprises a Si(001) or (001)-oriented cubic crystal substrate.

17. The method of claim 6, wherein the dielectric film comprises $SiO_2$, $SiN_x$, or $Al_2O_3$.

18. The method of claim 6, further comprising separating the first nanowire from the first of the at least two opposing (111)-type facets.

19. The method of claim 18, wherein the separating comprises removing a portion of the first nanowire's root end.

20. The method of claim 6, further comprising separating the second nanowire from the second of the at least two opposing (111)-type facets.

* * * * *